(12) United States Patent
Han et al.

(10) Patent No.: US 9,159,675 B2
(45) Date of Patent: Oct. 13, 2015

(54) INTEGRATED CIRCUIT AND DISPLAY DEVICE INCLUDING THE SAME

(71) Applicants: Ho Seok Han, Cheonan-si (KR); Ho Suk Maeng, Seoul (KR)

(72) Inventors: Ho Seok Han, Cheonan-si (KR); Ho Suk Maeng, Seoul (KR)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 123 days.

(21) Appl. No.: 13/939,034

(22) Filed: Jul. 10, 2013

(65) Prior Publication Data

US 2014/0027861 A1 Jan. 30, 2014

(30) Foreign Application Priority Data

Jul. 30, 2012 (KR) .................. 10-2012-0083238

(51) Int. Cl.
*H01L 23/544* (2006.01)

(52) U.S. Cl.
CPC ....... *H01L 23/544* (2013.01); *H01L 2223/5442* (2013.01); *H01L 2223/54426* (2013.01); *H01L 2223/54473* (2013.01); *H01L 2223/54486* (2013.01)

(58) Field of Classification Search
CPC .................................................. H01L 23/544
USPC .......................................... 257/797, E23.179
See application file for complete search history.

(56) References Cited

U.S. PATENT DOCUMENTS

| | | | |
|---|---|---|---|
| 7,825,529 B2 | 11/2010 | Horii | |
| 7,944,064 B2 | 5/2011 | Wakisaka et al. | |
| 8,008,788 B2 | 8/2011 | Koketsu et al. | |
| 8,023,112 B2 | 9/2011 | Harada et al. | |
| 2004/0227748 A1* | 11/2004 | Iwata et al. | 345/204 |
| 2005/0161836 A1* | 7/2005 | Yudasaka et al. | 257/797 |
| 2007/0099396 A1* | 5/2007 | Hirai et al. | 438/460 |
| 2008/0121819 A1* | 5/2008 | Tanaka et al. | 250/492.2 |
| 2008/0144048 A1* | 6/2008 | Ikebe et al. | 356/626 |
| 2008/0284048 A1 | 11/2008 | Kim et al. | |
| 2009/0206411 A1* | 8/2009 | Koketsu et al. | 257/368 |
| 2009/0273102 A1 | 11/2009 | Nogami et al. | |
| 2010/0304546 A1* | 12/2010 | Ogawa et al. | 438/401 |
| 2011/0001974 A1* | 1/2011 | Harada et al. | 356/401 |
| 2011/0076830 A1 | 3/2011 | Nogami et al. | |

FOREIGN PATENT DOCUMENTS

| | | |
|---|---|---|
| KR | 100809726 | 2/2008 |
| KR | 1020080048395 | 6/2008 |
| KR | 1020080059596 | 6/2008 |

* cited by examiner

*Primary Examiner* — Benjamin Sandvik
(74) *Attorney, Agent, or Firm* — Robert E. Bushnell, Esq.

(57) ABSTRACT

An integrated circuit that includes a substrate, a semiconductor layer arranged on the substrate and an insulating layer arranged on an upper portion of the semiconductor layer and including a bump provided on an upper surface thereof, wherein the semiconductor layer includes a main semiconductor area and an including an internal alignment mark including a p-type semiconductor that is overlapped by a metallic external alignment mark arranged on the upper surface of the insulating layer. The p-type semiconductor internal alignment mark can be viewed by an infrared camera during a mounting process of the integrated circuit.

52 Claims, 26 Drawing Sheets

INTEGRATED CIRCUIT AND DISPLAY DEVICE INCLUDING THE SAME

CLAIM OF PRIORITY

This application is based on and claims priority from Korean Patent Application No. 10-2012-0083238, filed on Jul. 30, 2012 in the Korean Intellectual Property Office, the disclosure of which is incorporated herein in its entirety by reference.

BACKGROUND OF THE INVENTION

1. Field of the Invention

The present invention relates to an integrated circuit and a display device including the same, and more particularly to an integrated circuit that includes alignment marks and a display device including the same.

2. Description of the Related Art

An integrated circuit (IC) is obtained by integrating electronic elements, such as transistors, resistors, and capacitors, on a single substrate or within the substrate to implement a function of a specified circuit. Since the integrated circuit has a reduced size in comparison to a circuit implemented by individually arranging the electronic elements and is integrally formed, the handling and wiring thereof are facilitated, and the mass production thereof becomes possible. Accordingly, the integrated circuit is used in various electronic devices.

With the development of technology, electronic devices having miniaturized sizes and various complicated functions are required. Accordingly, it is necessary that the size of an integrated circuit included in the electronic device is miniaturized and the structure thereof is complicated.

Recently, as the use of a mobile phone, a smart phone, a PMP, and a PDP increases, a display device is on the trend of miniaturization and thin filming. Accordingly, even in the display device, an integrated circuit having a miniaturized size and a complicated structure can be used. For example, the display device may use an integrated circuit as a device for driving a display panel that displays an image.

SUMMARY OF THE INVENTION

The integrated circuit may include a bump for signal input and output. If the size of the integrated circuit is miniaturized and the structure thereof is complicated, the number of bumps increases and the size of the bump decreases. If the number of bumps increases and the size of the bump decreases, a short between the bumps or misalignment of the bumps may occur when the integrated circuit is mounted on the substrate, and thus it is necessary to accurately align the integrated circuit on the substrate.

Accordingly, the present invention has been made to solve the above-mentioned problems occurring in the prior art, and one subject to be solved by the present invention is to provide an integrated circuit that facilitates the alignment thereof when the integrated circuit is mounted on the substrate.

Another subject to be solved by the present invention is to provide a display device that includes an integrated circuit that facilitates the alignment thereof when the integrated circuit is mounted on the substrate.

Additional advantages, subjects, and features of the invention will be set forth in part in the description which follows and in part will become apparent to those having ordinary skill in the art upon examination of the following or may be learned from practice of the invention.

According to one aspect of the present invention, there is provided an integrated circuit, including a substrate, a semiconductor layer arranged on the substrate and an insulating layer arranged on an upper portion of the semiconductor layer and including a bump provided on an upper surface thereof, wherein the semiconductor layer includes a main semiconductor area and an alignment mark area including a p-type semiconductor that is spaced apart from the main semiconductor area, the alignment mark area including an internal alignment mark.

The substrate may be a silicon substrate. The integrated circuit may also include an external alignment mark arranged on an upper surface of the insulating layer, the external alignment mark may overlap the internal alignment mark. A shape of the internal alignment mark may be defined by a shape of an area where the p-type semiconductor is arranged within the alignment mark area. The internal alignment mark may include a position alignment mark. The position alignment mark may have a shape that is symmetrical with respect to a first axis and a second axis that is orthogonal to the first axis.

The position alignment mark may include an NMOS transistor. The p-type semiconductor may include a first p-type semiconductor and a second p-type semiconductor arranged over the first p-type semiconductor and being spaced apart from the first p-type semiconductor, and the NMOS transistor may include the first p-type semiconductor, the second p-type semiconductor, and an n-type semiconductor arranged between the first p-type semiconductor and the second p-type semiconductor. The second p-type semiconductor may include a first doping area and a second doping area that are spaced apart from each other and are n+ doped, and the NMOS transistor may further include a gate electrode arranged between the first doping area and the second doping area. The position alignment mark may include a plurality of NMOS transistors.

The position alignment mark may be cross-shaped. The position alignment mark may be diamond-shaped. The internal alignment mark may also include a direction alignment mark. The direction alignment mark may be asymmetrical with respect to the first axis and the second axis. The direction alignment mark may be spaced apart from the position alignment mark. The internal alignment mark may also include an area definition alignment mark that defines the alignment mark area. The area definition alignment mark may surround a circumference of the alignment mark area, and the position alignment mark and the direction alignment mark may be arranged within the area definition alignment mark. A shape of the internal alignment mark may be defined by a shape of an area where the p-type semiconductor is absent within the alignment mark area. The alignment mark area may include an NMOS transistor. The internal alignment mark may include a position alignment mark. The position alignment mark may be symmetrical with respect to a first axis and a second axis that is orthogonal to the first axis. The position alignment mark may be cross-shaped. The position alignment mark may be diamond-shaped. The internal alignment mark may also include a direction alignment mark. The direction alignment mark may be asymmetrical with respect to the first axis and the second axis. The direction alignment mark may be spaced apart from the position alignment mark.

According to another aspect of the present invention, there is provided an integrated circuit that includes a substrate, a semiconductor layer arranged on the substrate and an insulating layer arranged on an upper portion of the semiconductor layer and including a bump provided on an upper surface thereof, the semiconductor layer may include a main semiconductor area and an internal alignment mark including a p-type semiconductor that are connected to each other. The substrate may be a silicon substrate. The integrated circuit may also include an external alignment mark arranged on an upper surface of the insulating layer, the external alignment mark may overlap the internal alignment mark. A shape of the internal alignment mark may be defined by a shape of an area where the p-type semiconductor is arranged within the alignment mark area. The internal alignment mark may include a position alignment mark. The position alignment mark may be connected to the main semiconductor layer. The internal alignment mark may also include a direction alignment mark. The direction alignment mark may be connected to the main semiconductor layer. The internal alignment mark may also include an area definition alignment mark that defines the alignment mark area. The area definition alignment mark may be connected to the main semiconductor area.

According to another aspect of the present invention, there is provided an integrated circuit that includes a substrate, a semiconductor layer arranged on the substrate and an insulating layer arranged on an upper portion of the semiconductor layer and including a bump provided on an upper surface thereof, wherein the semiconductor layer includes a main semiconductor layer and an intaglio alignment mark that includes a p-type semiconductor that is connected to the main semiconductor area, wherein an internal alignment mark is defined by an area surrounded by the intaglio alignment mark and where the p-type semiconductor is absent. The substrate may be a silicon substrate. The integrated circuit may also include an external alignment mark arranged on an upper surface of the insulating layer, the external alignment mark may overlap the internal alignment mark. The internal alignment mark may include a position alignment mark. The internal alignment mark may also include a direction alignment mark. The internal alignment mark may also include an area definition alignment mark that defines an alignment mark area, the position alignment mark and the direction alignment mark are arranged within the area definition alignment mark.

According to another aspect of the present invention, there is provided a display device that includes a display panel and a driving unit to drive the display panel, the driving unit may include an integrated circuit, the integrated circuit may include a substrate, a semiconductor layer arranged on the substrate and an insulating layer arranged on an upper portion of the semiconductor layer and including a bump provided on an upper surface thereof, the semiconductor layer may include an alignment mark area including a p-type semiconductor, the alignment mark area may also include an internal alignment mark. The substrate may be a silicon substrate. The display device may also include an external alignment mark arranged on an upper surface of the insulating layer, the external alignment mark may overlap the internal alignment mark. A shape of the internal alignment mark may be defined by a shape of an area where the p-type semiconductor is arranged within the alignment mark area. The internal alignment mark may include a position alignment mark. The internal alignment mark may also include a direction alignment mark. The internal alignment mark may also include an area definition alignment mark that defines the alignment mark area. A shape of the internal alignment mark may be defined by a shape of an area where the p-type semiconductor is absent within the alignment mark area. The internal alignment mark may include a position alignment mark. The internal alignment mark may also include a direction alignment mark.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present invention will be described in detail with reference to the accompanying drawings.

Figure 1:
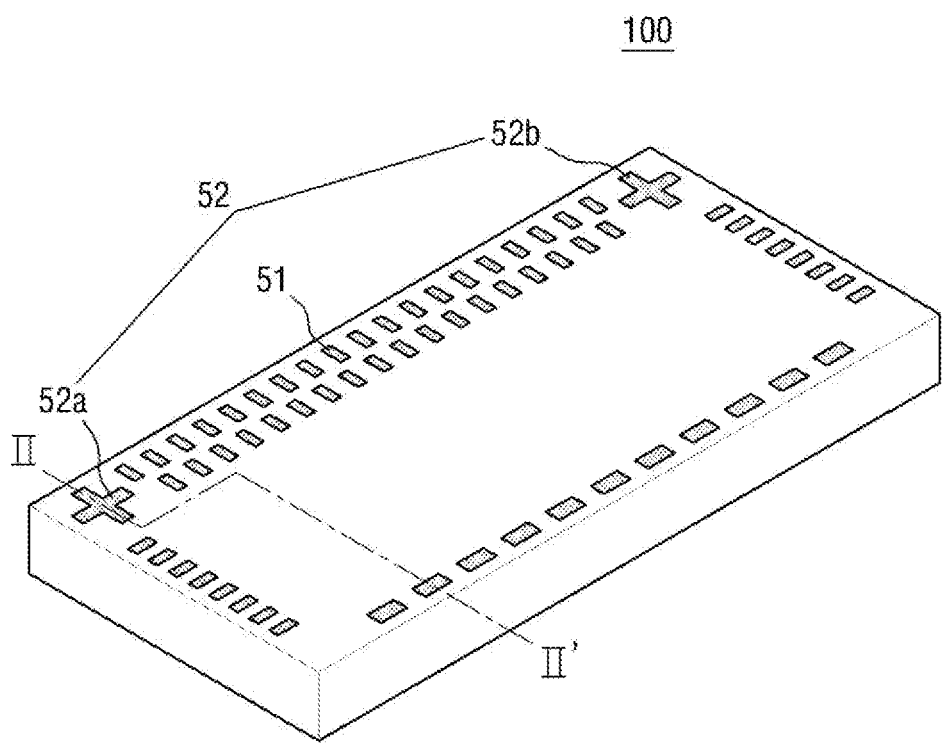
FIG. 1 is a perspective view of an integrated circuit according to an embodiment of the present invention.

Turning now to FIG. 1, FIG. 1 is a perspective view of an integrated circuit according to an embodiment of the present invention. Referring to FIG. 1, an integrated circuit 100 includes a bump 51 provided on one surface thereof. The integrated circuit 100 may include a plurality of bumps 51, and the arrangement of the bumps 51 and the shape of the size of the bumps 51 may variously be changed. The bumps 51 may be made of a conductive material such as metal. The integrated circuit 100 may output a signal to an outside through the bumps 51 or receive a signal from the outside.

The integrated circuit 100 may further include an external alignment mark 52. The external alignment mark 52 may be arranged on the same surface as one surface of the integrated circuit 100 on which the bumps 51 are arranged. The external alignment mark 52 may be made of, but is not limited to, metal, and may be formed of various materials so that the external alignment mark 52 has a shape that can be identified from the outside. In some embodiments, the external alignment mark 52 may be formed of the same material as the bump 51.

The external alignment mark 52 may be arranged to be adjacent to the edge of one surface of the integrated circuit 100, and more particularly, may be arranged to be adjacent to the corner of the one surface of the integrated circuit 100, however, the arrangement of the external alignment mark 52 is not limited thereto.

The external alignment mark 52 may provide the basis for aligning the position of the integrated circuit 100 when the integrated circuit 100 is mounted on another electronic element such as a substrate or the like. For example, a chip mounting machine may sense the external alignment mark 52 through a camera and arrange the integrated circuit 100 on the basis of the position of the external alignment mark 52.

FIG. 1 illustrates that the external alignment mark 52 is cross-shaped, however, the shape of the external alignment mark 52 is not limited thereto, as the external alignment mark 52 may be, for example, diamond-shaped. FIG. 1 illustrates that the integrated circuit 100 includes two external alignment marks 52a and 52b, however, the configuration of the integrated circuit 100 is not limited thereto, as the integrated circuit 100 may include one alignment mark 52 only, or may include three or more alignment marks 52. In some embodiments, the integrated circuit 100 may not include the external alignment mark 52.

Figure 2:
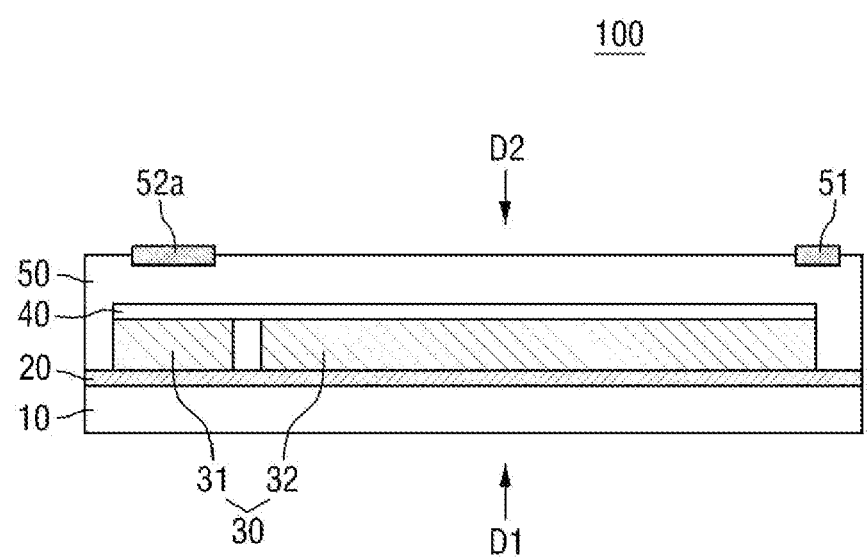
FIG. 2 is a cross-sectional view taken along lines II and II' in FIG. 1.

Hereinafter, referring to FIG. 2, the integrated circuit 100 according to an embodiment of the present invention will be described in more detail. FIG. 2 is a cross-sectional view taken along lines II and II' in FIG. 1.

Referring to FIG. 2, the integrated circuit 100 includes a substrate 10 and an alignment mark area 31. The substrate 10 may function as a material for forming a circuit in the integrated circuit 100 on an upper portion of the substrate 10. In some embodiment, the substrate 10 may be formed of silicon (Si). The substrate 10 is not necessarily formed of silicon, but may be formed of other materials through which infrared rays can pass. For example, the substrate 10 may be formed of silicon oxide, glass, or transparent synthetic resin.

The alignment mark area 31 may be arranged on the substrate. Over the alignment mark area 31, the alignment mark may be formed. The alignment mark area 31 may be an area that can function to align the position of the integrated circuit 100 during the chip mounting of the integrated circuit 100, and include the alignment mark and a surrounding area that is adjacent to the alignment mark. The alignment mark area 31 may be formed in the same process as a main semiconductor layer 32 when a semiconductor layer 30 to be described later is formed.

The alignment mark area 31 may be arranged to be spaced apart from the main semiconductor layer 32. The alignment mark area 31 may be arranged to be adjacent to the side surface of the integrated circuit 100, and for example, may be arranged to be adjacent to the corner of the surface of the integrated circuit 100 as seen from direction D1. The alignment mark area 31 may be arranged to overlap the external alignment mark 52a. In some embodiments, although not illustrated, if a plurality of external alignment marks 52a and 52b are provided, a plurality of alignment mark areas 31 may be formed at corresponding locations. In some embodiments, the alignment mark area 31 may be arranged in an area where the external alignment marks 52a and 52b are not formed, and even if the external alignment marks 52a and 52b are omitted, the integrated circuit 100 may include the alignment mark area 31.

The alignment mark area 31 may include a p-type semiconductor. If the integrated circuit 100 is photographed using an infrared camera in direction D1, infrared rays, having passed through the substrate 10, may be reflected by the p-type semiconductor and then be detected by the infrared camera. Accordingly, the internal alignment mark formed in the alignment mark area 31 can be identified via an infrared camera. Since the internal alignment mark formed in the alignment mark area 31 can be identified using an infrared camera arranged on an opposite side to the surface on which the bumps 51 of the integrated circuit are formed, the alignment mark can be identified despite the presence of an object on which the integrated circuit 100 is to be mounted, and thus the integrated circuit 100 can be accurately aligned during a chip mounting process. The internal alignment mark will be described in more detail later.

Since the integrated circuit 100 includes not only the external alignment mark 52 but also the alignment mark area 31, the integrated circuit 100 can be aligned through identification of the external alignment mark 52 in direction D2 during the chip mounting. Further, since the integrated circuit can be aligned through identification of the internal alignment mark within the alignment mark area 31 through the infrared camera in direction D1, the accuracy of the alignment, overlay and registration can be improved. The alignment through the external alignment mark 52 and the alignment through the internal alignment mark may be sequentially or simultaneously performed, or either of them may be selectively performed.

The integrated circuit 100 may further include a first insulating layer 20, a main semiconductor layer 32, a wiring layer 40, and a second insulating layer 50. The first insulating layer 20 may be arranged on the upper portion of the substrate 10, or may be arranged between the substrate 10 and the semiconductor layer 30. In some embodiments, in the case where the substrate 10 is formed of silicon, the first insulating layer 20 may be formed of silicon oxide that is formed by oxidizing a surface of the substrate 10, however, the forming of the first insulating layer 20 is not limited thereto, as the first insulating layer 20 may be formed by arranging an insulating material on the upper surface of the substrate 10 via a deposition or other application process.

The main semiconductor layer 32 may be arranged on the upper portion of the first insulating layer 20. The main semiconductor layer 32 may be formed on the same layer as the alignment area 31 in the same process. The main semiconductor layer 32 may be arranged to be adjacent to the center portion or to be spaced apart from the alignment mark area 31 when the integrated circuit 100 is seen in direction D2. On the main semiconductor layer 32, a semiconductor structure for forming a plurality of transistors or diodes may be arranged. The main semiconductor layer 32 may be an area where a semiconductor device for driving the integrated circuit 100 is arranged.

The wiring layer 40 may be arranged on upper portions of the main semiconductor layer 32 and the alignment mark area 31. The wiring layer 40 may include electronic elements, such as resistors, capacitors, and inductors, and wirings. The wirings may electrically connect the electronic elements, such as transistors and diodes, formed on the main semiconductor layer 32 to the electronic elements formed on the wiring layer 40. The wiring layer 40 may further include an insulating material for insulating wirings or electronic elements from each other.

The second insulating layer 50 may be arranged on the upper portion of the wiring layer 40. The second insulating layer 50 may include the bumps 51 and the external alignment mark 52 provided on the upper surface thereof. The second insulating layer 50 may form an external appearance of an upper surface on which the bumps 51 of the integrated circuit 100 are arranged, and the second insulating layer 50 may extend from side surfaces of the integrated circuit 100 to form the external appearance of the side surfaces. The second insulating layer 50 may be formed to include, but is not limited to, a silicon nitride film, a silicon oxide film, or a silicon oxynitride film. Although not illustrated, in the second insulating layer 50, a wiring for connecting the bumps 51 to the wiring layer 40 may be included.

Figure 3:
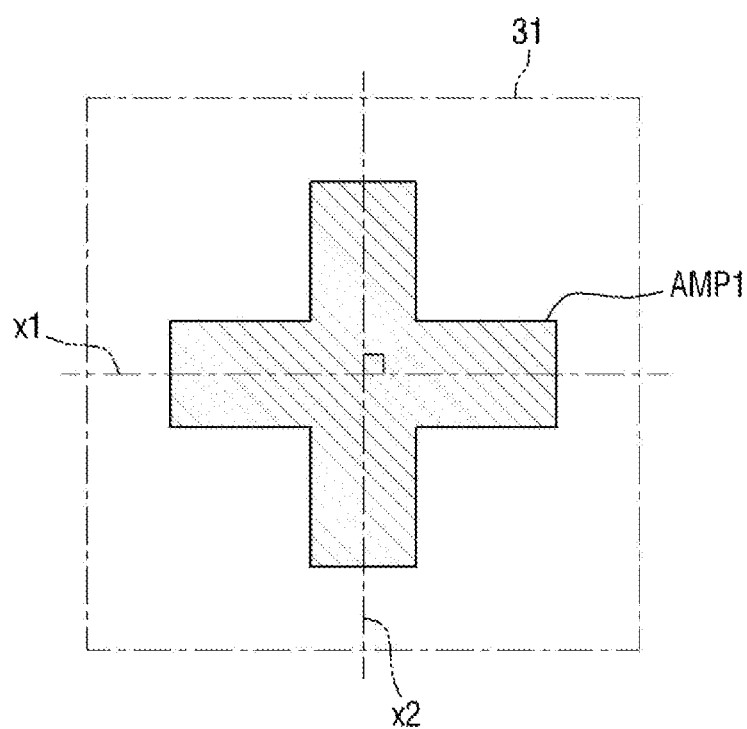
FIG. 3 is a plan view of an alignment mark area according to an embodiment of the present invention.

Thereafter, referring to FIGS. 3 to 17, internal alignment marks will be described in more detail. FIG. 3 is a plan view of an internal alignment mark area according to an embodiment of the present invention.

The shape of the internal alignment mark may be defined by an area in which a p-type semiconductor is arranged when the alignment mark area 31 as seen from direction D1 in FIG. 2. Referring to FIG. 3, the internal alignment mark may include a position alignment mark AMP1. The position alignment mark AMP1 may be arranged inside the alignment mark area 31, and in the alignment mark area 31, the p-type semiconductor may be absent except for the area where the position alignment mark AMP1 is arranged.

The position alignment mark AMP1 may have a shape that is symmetrical with respect to two axes of x1 and x2 that are orthogonal to each other, or the end portion of the position alignment mark AMP1 may extend in the directions of x1 and x2 axes. Although FIG. 3 illustrates that the position alignment mark AMP1 is cross-shaped, the shape of the position alignment mark may instead have other various shapes, such as a square shape or a diamond shape that is symmetrical with respect to the x1 and x2 axes, or the end portion of the position alignment mark AMP1 may extend in the directions of x1 and x2 axes. In some embodiments, if the surface on which the bumps 51 of the integrated circuit 100 are arranged on the opposite surface thereof has a rectangular shape or a shape that is close to the rectangular shape, the x1 and x2 axes may be axes which are parallel to two sides of the rectangle that are orthogonal to each other. During the chip mounting, a position chip mounting machine can accurately align the integrated circuit 100 by calculating an error in overlay of the arrangement position of the integrated circuit 100 and an angle that is distorted in the horizontal direction through identification of x1 and x2 axes from the position alignment mark AMP1.

Figure 4:
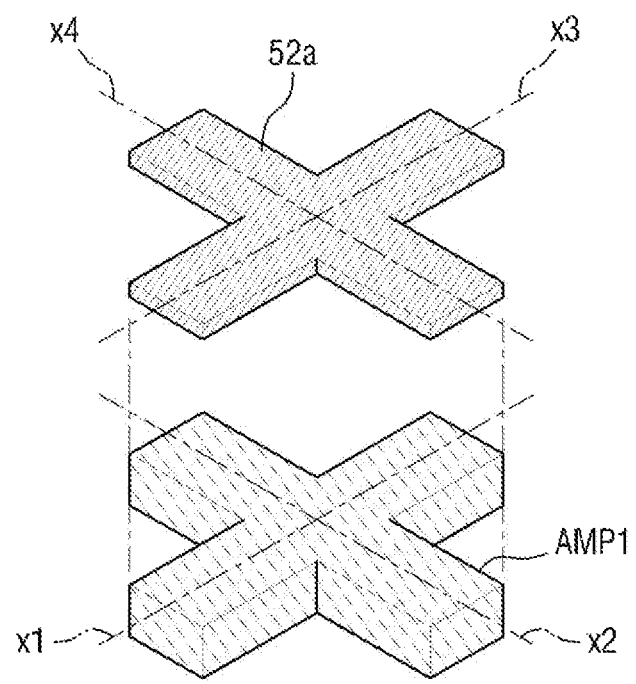
FIG. 4 is a perspective view illustrating an arrangement of an alignment mark and an external alignment mark according to an embodiment of the present invention.

Referring to FIG. 4, the positional relationship between the position alignment mark AMP1 and the external alignment mark 52a will be described in more detail. FIG. 4 is a perspective view illustrating the arrangement of the position alignment mark AMP1 and the external alignment mark 52a according to an embodiment of the present invention.

Referring to FIG. 4, the external alignment mark 52a may have a shape that is symmetrical with respect to two axes of x3 and x4 that are orthogonal to each other, or the end portion of the external alignment mark 52a may extend in the directions of x3 and x4 axes. When the integrated circuit 100 is seen from direction D1 or D2, the position alignment mark AMP1 and the external alignment mark 52a may be arranged so that the x3 axis overlaps the x1 axis, and the x4 axis overlaps the x2 axis. If the position alignment mark AMP1 and the external alignment mark 52a are arranged so that the x3 axis overlaps the x1 axis, and the x4 axis overlaps the x2 axis, the integrated circuit 100 can be aligned by applying the same position setting with respect to the alignment through the position alignment mark AMP1 and the alignment through the external alignment mark 52a during the chip mounting, and thus the convenience in processes can be increased.

The position alignment mark AMP1 may have a shape that completely overlaps the external alignment mark 52a, however, the shape of the position alignment mark AMP1 is not limited thereto, as the shape of the position alignment mark AMP1 may be varied within the range in which the x1 axis and the x2 axis are kept constant. For example, the size of the position alignment mark AMP1 may be larger or smaller than the external alignment mark 52a, and may have a shape that extends to be longer or shorter than the external alignment mark 52a in the direction of the x1 or x2 axis. Further, the position alignment mark AMP1 may keep to the x1 axis and the x2 axis, but may have a shape that is quite different from the external alignment mark 52a.

Figure 5:
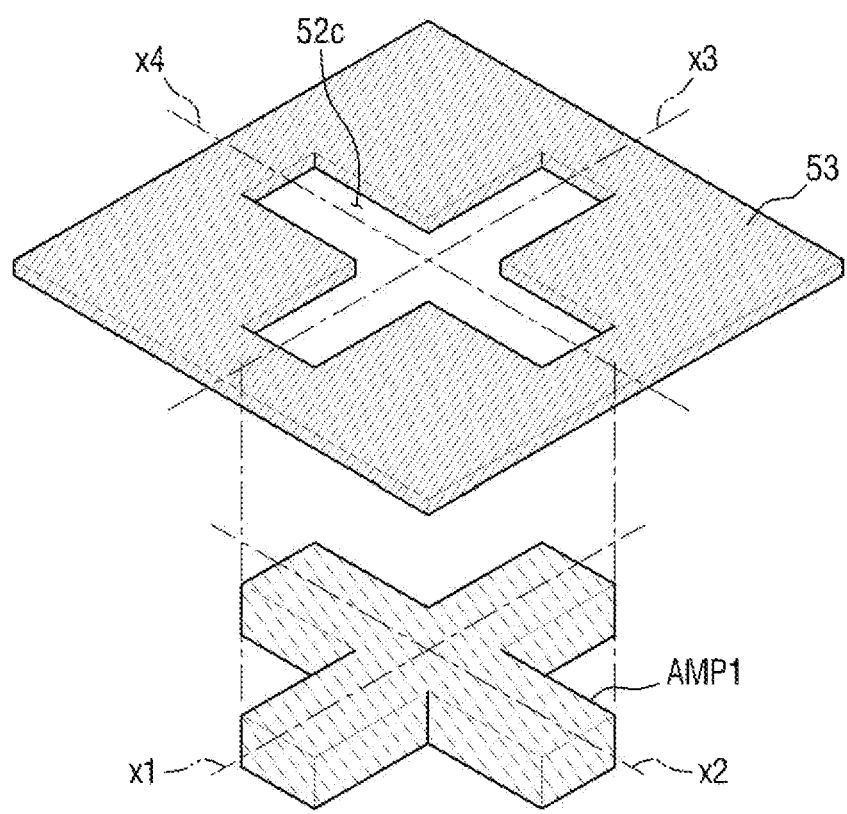
FIG. 5 is a perspective view illustrating an arrangement of an alignment mark and an external alignment mark according to another embodiment of the present invention.

Turning now to FIG. 5, FIG. 5 is a perspective view illustrating the arrangement of the internal alignment mark and the external alignment mark according to another embodiment of the present invention. Referring to FIG. 5, the external alignment mark 52 may be formed by intaglio. That is, the external alignment mark 52 may be defined by the absence of an opaque metal film. In FIG. 5, an intaglio alignment mark 53 that is made of a material such as metal may be formed in the circumferential area of the external alignment mark 52a, and the area in which the intaglio alignment mark 53 is not arranged (i.e. the inside of the intaglio alignment mark 53) may be defined as the external alignment mark 52c. Here, the term intaglio essentially means that the external alignment mark is akin to a photographic negative of that of FIG. 4, where the external alignment mark is defined as the portion of an alignment mark area that the opaque metal film is absent, as opposed to the arrangement in FIG. 4 where the external alignment mark is defined as the portion of the alignment mark area where the metal film is present.

In the same manner as the external alignment mark 52a in FIG. 2, the external alignment mark 52c may have a shape that is symmetrical with respect to two axes of x3 and x4 that are orthogonal to each other, or the end portion of the external alignment mark 52c may extend in the directions of x3 and x4 axes. When the integrated circuit 100 is seen from direction D1 or D2, the position alignment mark AMP1 and the external alignment mark 52c may be arranged so that the x3 axis overlaps the x1 axis, and the x4 axis overlaps the x2 axis.

The position alignment mark AMP1 may have a shape that completely overlaps the external alignment mark 52c. That is, the position alignment mark AMP1 may be formed to completely overlap a vacant area on the inside of the intaglio alignment mark 53, however, the shape of the position alignment mark AMP1 is not limited thereto, as the shape of the position alignment mark AMP1 may be varied within the range in which the x1 axis and the x2 axis are kept constant. For example, the size of the position alignment mark AMP1 may instead be larger or smaller than the external alignment mark 52c, and may have a shape that extends to be longer or shorter than the external alignment mark 52c in the direction of the x1 or x2 axis. Further, the position alignment mark AMP1 may keep the x1 axis and the x2 axis, but may have a shape that is quite different from the external alignment mark 52c.

Hereinafter, alignment marks according to other embodiments of the present invention will be described.

Figure 6:
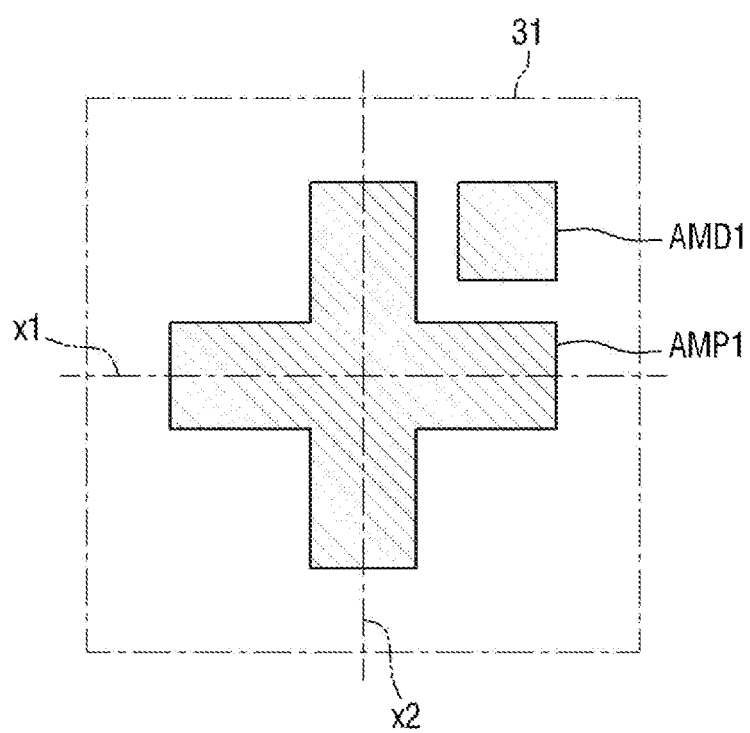
FIG. 6 is a plan view of an alignment mark area according to still another embodiment of the present invention.

Turning now to FIG. 6, FIG. 6 is a plan view of an alignment mark area according to still another embodiment of the present invention. Referring to FIG. 6, the internal alignment mark may include a position alignment mark AMP1 and a direction alignment mark AMD1.

The direction alignment mark AMD1 may have a shape that is asymmetrical with respect to the x1 axis and the x2 axis. For example, the direction alignment mark AMD1 may be arranged in only one of four quadrants formed by the x1 axis and the x2 axis. FIG. 6 illustrates that the direction alignment mark AMD1 is arranged in the right upper quadrant, however, the arrangement of the direction alignment mark AMD1 is not limited thereto, as it may be arranged in another quadrant. Although FIG. 6 illustrates the square direction alignment mark AMD1, the shape of the direction alignment mark AMD1 is not limited thereto, but may have, for example, various other shapes, such as a circle and a triangle.

During the chip mounting, the chip mounting machine may determine whether the integrated circuit 100 is in a normal state or in a reverse state through identifying the position of the arrangement of the direction alignment mark AMD1 through an infrared camera.

Although not illustrated, the external alignment mark 52a may further include a shape that is substantially the same as the direction alignment mark and at a location that overlaps the direction alignment mark AMD1.

Figure 7:
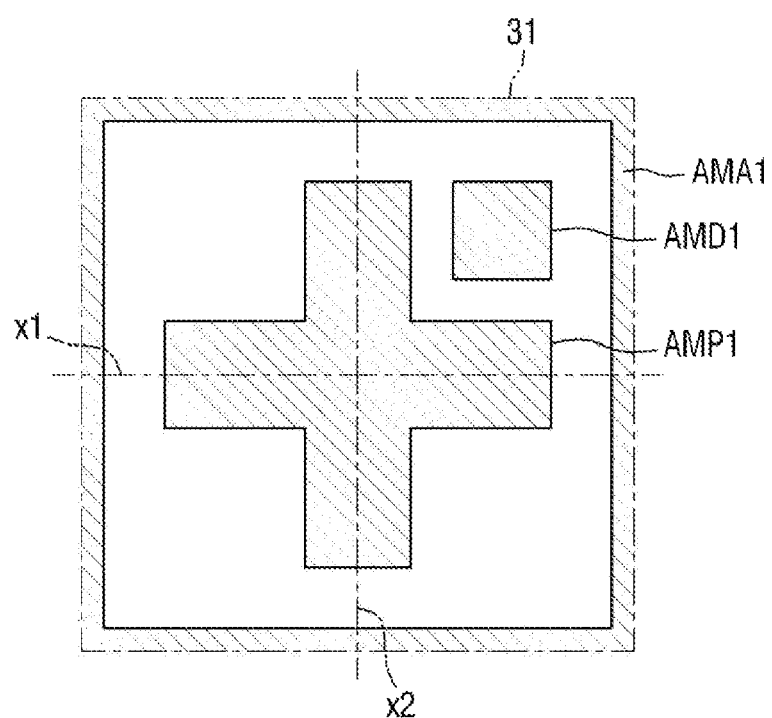
FIG. 7 is a plan view of an alignment mark area according to still another embodiment of the present invention.

Turning now to FIG. 7, FIG. 7 is a plan view of an alignment mark area according to still another embodiment of the present invention. Referring to FIG. 7, the internal alignment mark may include a position alignment mark AMP1, a direction alignment mark AMD1, and an area definition alignment mark AMA1.

The area definition alignment mark AMA1 is arranged along the circumference of the alignment mark area 31, and the alignment mark area 31 may be defined along the outline of the area definition alignment mark AMA1. The area definition alignment mark AMA1 may clear up the boundary between the alignment mark area 31 and the outside, and enable the alignment marks AMP1, AMD1, and AMA1 to be detected more easily by an infrared camera.

Figure 8:
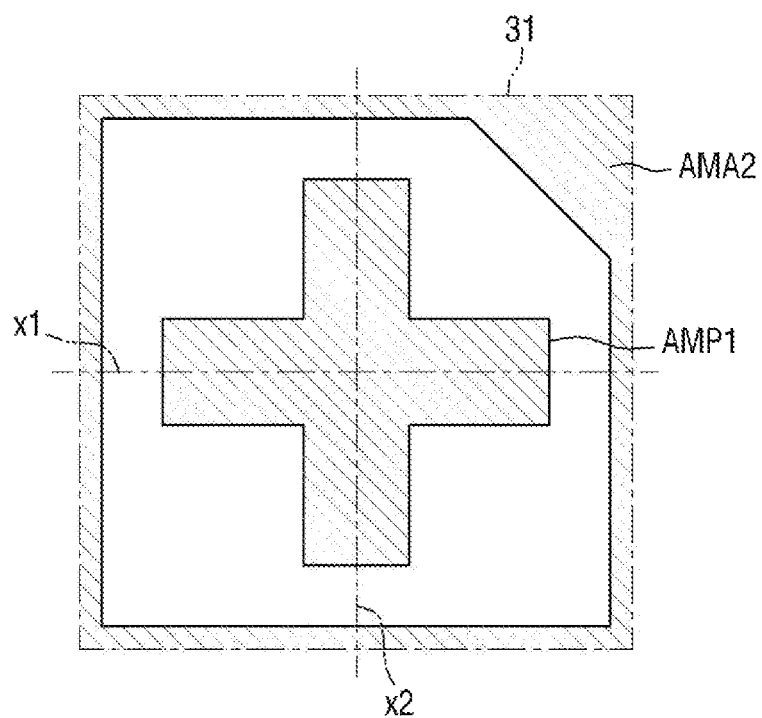
FIG. 8 is a plan view of an alignment mark area according to still another embodiment of the present invention.

Turning now to FIG. 8, FIG. 8 is a plan view of an alignment mark area according to still another embodiment of the present invention. Referring to FIG. 8, the internal alignment mark may include a position alignment mark AMP1 and an area definition alignment mark AMA2.

The area definition alignment mark AMA2 may be formed to have a shape that is not symmetrical with respect to the x1 axis and the x2 axis. For example, the area definition alignment mark AMA2 may have a shape in which one corner neighboring area extends to the inside in comparison to other corners. FIG. 8 illustrates that the neighboring area of the right upper corner of the area definition alignment mark AMA2 extends to the inside, however, according to variations of this embodiment, the neighboring area of another corner may extend to the inside. In some variations, the area definition alignment mark AMA2 may be formed to have various shapes that are not symmetrical with respect to the x1 axis and the x2 axis. If the area definition alignment mark AMA2 has a shape that is not symmetrical with respect to the x1 axis and the x2 axis, the chip mounting machine may determine whether the integrated circuit is in a reverse state through identifying the shape of the area definition alignment mark AMA2. That is, the area definition alignment mark AMA2 may simultaneously perform the functions of the area definition alignment mark AMA1 and the direction alignment mark AMD1 in FIG. 7.

Figure 9:
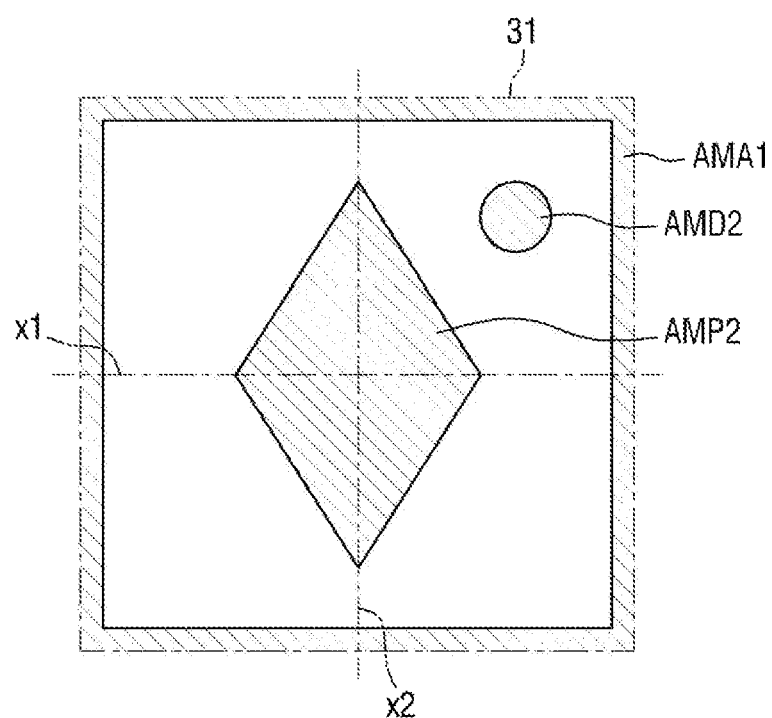
FIG. 9 is a plan view of an alignment mark area according to still another embodiment of the present invention.

Turning now to FIG. 9, FIG. 9 is a plan view of an alignment mark area according to still another embodiment of the present invention. Referring to FIG. 9, the internal alignment mark may include a position alignment mark AMP2, a direction alignment mark AMD2, and an area definition alignment mark AMA1. The position alignment mark AMP2 may have a diamond shape which is symmetrical with respect to the x1 axis and the x2 axis or which extends along the x1 axis and the x2 axis.

The direction alignment mark AMD2 may have a shape that is asymmetrical with respect to the x1 axis and the x2 axis, and may be arranged in only one of four quadrants formed by the x1 axis and the x2 axis. The direction alignment mark AMD2 may have a circular shape.

Figure 10:
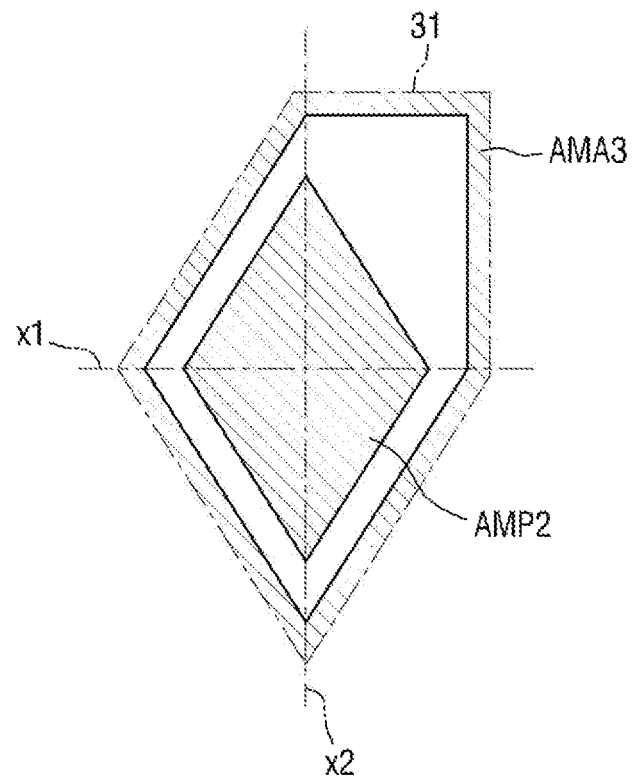
FIG. 10 is a plan view of an alignment mark area according to still another embodiment of the present invention.

Turning now to FIG. 10, FIG. 10 is a plan view of an alignment mark area according to still another embodiment of the present invention. Referring to FIG. 10, the internal alignment mark may include a position alignment mark AMP2 and an area definition alignment mark AMA3.

The area definition alignment mark AMA3 may be spaced apart from the position alignment mark AMP2 and may be formed along the outline of the position alignment mark AMP2. At least a partial area of the area definition alignment mark AMP2 may not be formed along the outline of the position alignment mark AMP2. As illustrated in FIG. 10, the right upper area of four quadrants divided by the x1 axis and the x2 axis of the area definition alignment mark AMA3 may not be formed along the position alignment mark AMP2. In this case, the area definition alignment mark AMA3 may include a shape that is not symmetrical with respect to the x1 axis and the x2 axis, and the chip mounting machine may determine whether the integrated circuit 10 is in a reverse state through identifying the shape of the area definition alignment mark AMA3.

Figure 11:
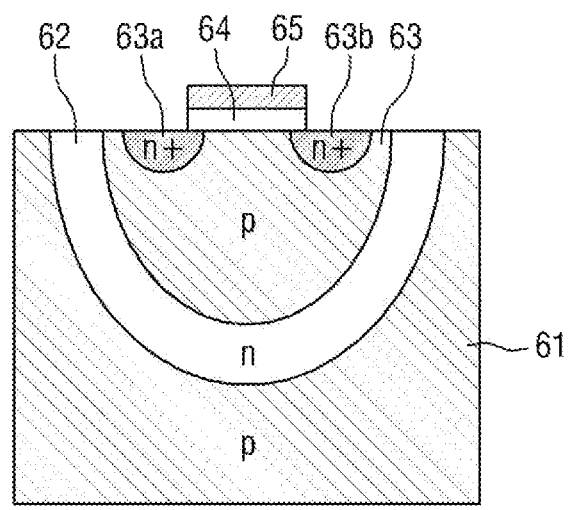
FIG. 11 is a cross-sectional view of an NMOS according to still another embodiment of the present invention.

According to still another embodiment of the present invention, the internal alignment mark may be formed to include an NMOS (N-channel Metal Oxide Semiconductor) transistor. Hereinafter, referring to FIGS. 11 and 12, this will be described in more detail. Turning now to FIG. 11, FIG. 11 is a cross-sectional view of an NMOS transistor according to still another embodiment of the present invention. Referring to FIG. 11, the NMOS transistor may include a first p-type semiconductor 61, an n-type semiconductor 62, a second p-type semiconductor 63, an insulating film 64, and a gate electrode 65.

The first p-type semiconductor 61 is arranged on a base portion of the NMOS transistor. A curved shape may be formed on one surface of the first p-type semiconductor 61, and the n-type semiconductor 62 may be arranged on the curved surface of the first p-type semiconductor 61 to form an n-well. On the inside of the n-well formed by the n-type semiconductor 62, the second p-type semiconductor 63 may be arranged. A first doping area 63a and a second doping area 63b may be formed on the second p-type semiconductor 63. The first doping area 63a and the second doping area 63b may be areas which are n+ doped through making impurities permeate into the second p-type semiconductor 63. The first doping area 63a and the second doping area 63b may be arranged to be spaced apart from each other. The first doping area 63a and the second doping area 63b may be arranged to be adjacent to the gate electrode 65. If a voltage of a predetermined level is applied to the gate electrode 65, a channel may be formed between the first doping area 63a and the second doping area 63b of the second p-type semiconductor 63, and current may flow between the first doping area 63a and the second doping area 63b. That is, the first doping area 63a and the second doping area 63b may function as a source or a drain of each transistor.

The insulating film 64 may be arranged between the second p-type semiconductor 63 and the gate electrode 65 to insulate the second p-type semiconductor 63 and the gate electrode 65 from each other. The gate electrode 65 may be arranged on the upper portion of the insulating film 64, and the channel forming may be controlled according to the voltage that is applied to the gate electrode 65.

Even if the alignment mark is formed to include a NMOS transistor, the outline of the first p-type semiconductor layer 61 may be detected by the infrared camera, and thus internal the alignment mark may perform the alignment function of the integrated circuit 100 during the chip mounting process.

Figure 12:
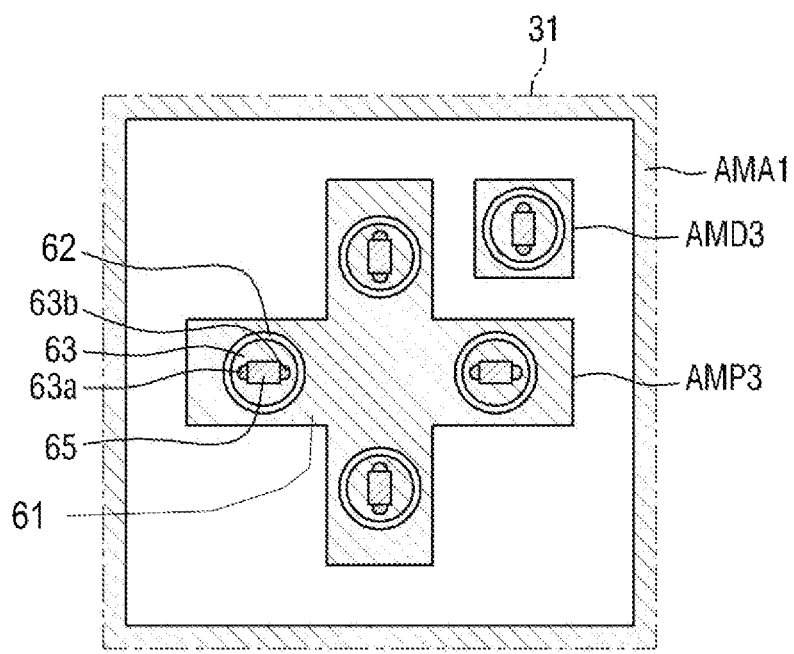
FIG. 12 is a plan view of an alignment mark area according to still another embodiment of the present invention.

Hereinafter, referring to FIG. 12, the internal alignment mark that includes NMOS transistors will be described in more detail. FIG. 12 is a plan view of an alignment mark area according to still another embodiment of the present invention. More specifically, FIG. 12 is a plan view when the alignment mark area is seen in direction D2 in FIG. 2.

The internal alignment mark may include a position alignment mark AMP3, a direction alignment mark AMD3, and an area definition alignment mark AMA1. The arrangement and the outline shape of the position alignment mark AMP3 and the direction alignment mark AMD3 may be substantially the same as the position alignment mark AMP1 and the direction alignment mark AMD1 in FIG. 6.

The position alignment mark AMP3 and the direction alignment mark AMD3 may include NMOS transistors. The first p-type semiconductor 61 is arranged to form the outline of the position alignment mark AMP3 and the direction alignment mark AMD3. On a partial area of the first p-type semiconductor 61, the n-type semiconductor 62 that forms the n-well may be arranged. The second p-type semiconductor area 63 that includes the first and second doping areas 63a and 63b may be arranged on the inside of the n-type semiconductor 62, and the insulating film 64 and the gate electrode 65 may be arranged on the upper portion thereof to form the NMOS transistor. A plurality of NMOS transistors may be formed within each alignment mark area 31. The NMOS transistors formed on the internal alignment mark may be electrically connected to other electronic elements that are included in the integrated circuit 100 through the wiring layer 40. Once the NMOS transistors are formed on the internal alignment mark, the alignment mark area 31 can be used as a circuit, and thus the capacity of the integrated circuit 100 can be heightened.

The arrangement of the NMOS transistors illustrated in FIG. 12 is merely exemplary, and the position, the number, and the shape of the arranged NMOS transistors may be changed according to the embodiments. In some embodiments, if the width of the area definition alignment mark AMA1 is large enough to form the NMOS transistors, or if the NMOS transistors can be formed with a size that is small enough to arrange the NMOS transistors on the area definition alignment mark AMA, the NMOS transistors may be formed even on the area definition alignment mark AMA1.

Figure 13:
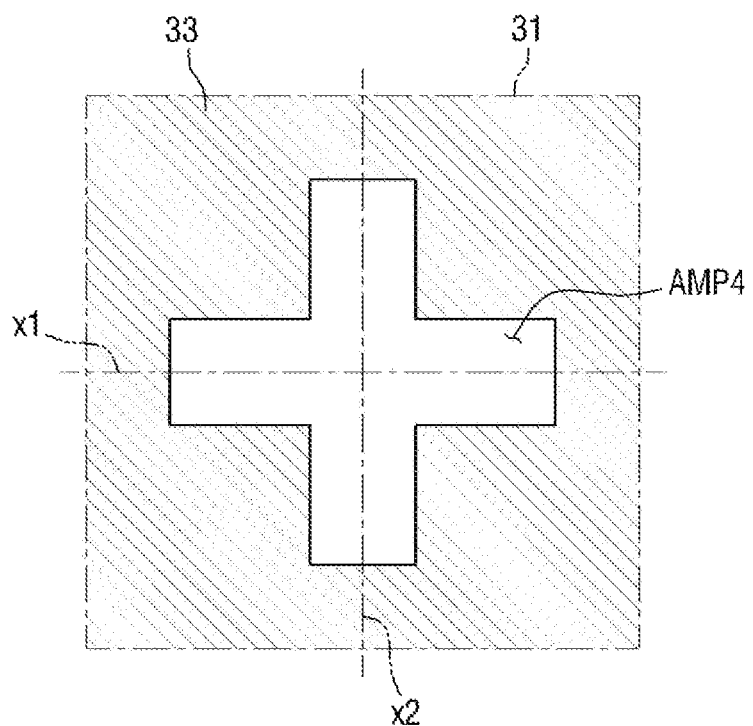
FIG. 13 is a plan view of an alignment mark area according to still another embodiment of the present invention.

Thereafter, referring to FIG. 13, an internal alignment mark according to still another embodiment of the present invention will be described. FIG. 13 is a plan view of an alignment mark area according to still another embodiment of the present invention.

Referring to FIG. 13, the internal alignment mark may be formed by intaglio. That is, an intaglio alignment mark 33 that includes the p-type semiconductor may be arranged in the alignment mark area 31, and the portions of the alignment mark area 31 that is absent of the intaglio alignment mark 33 serves as the internal alignment mark. The outer edge of the intaglio alignment mark 33 may define a periphery of the alignment mark area 31. Here, the term intaglio essentially means that the internal alignment mark is akin to a photographic negative of that of FIG. 3, where the internal alignment mark is defined as the portion of the alignment mark area that the p-type semiconductor is absent, as opposed to the arrangement in FIG. 3 where the internal alignment mark is defined as the portion of the alignment mark area where the p-type semiconductor is present.

The alignment mark may include a position alignment mark AMP4. The position alignment mark AMP4 may have a shape that is symmetrical with respect to two axes of x1 and x2 that are orthogonal to each other, or the end portion of the position alignment mark AMP4 may extend in the directions of x1 and x2 axes. Although FIG. 13 illustrates that the position alignment mark AMP4 is cross-shaped, the position alignment mark may have various shapes, for example, the position alignment mark may have a square shape or a diamond shape that is symmetrical with respect to the x1 and x2 axes, or the end portion of the position alignment mark AMP4 may extend in the directions of x1 and x2 axes.

Figure 14:
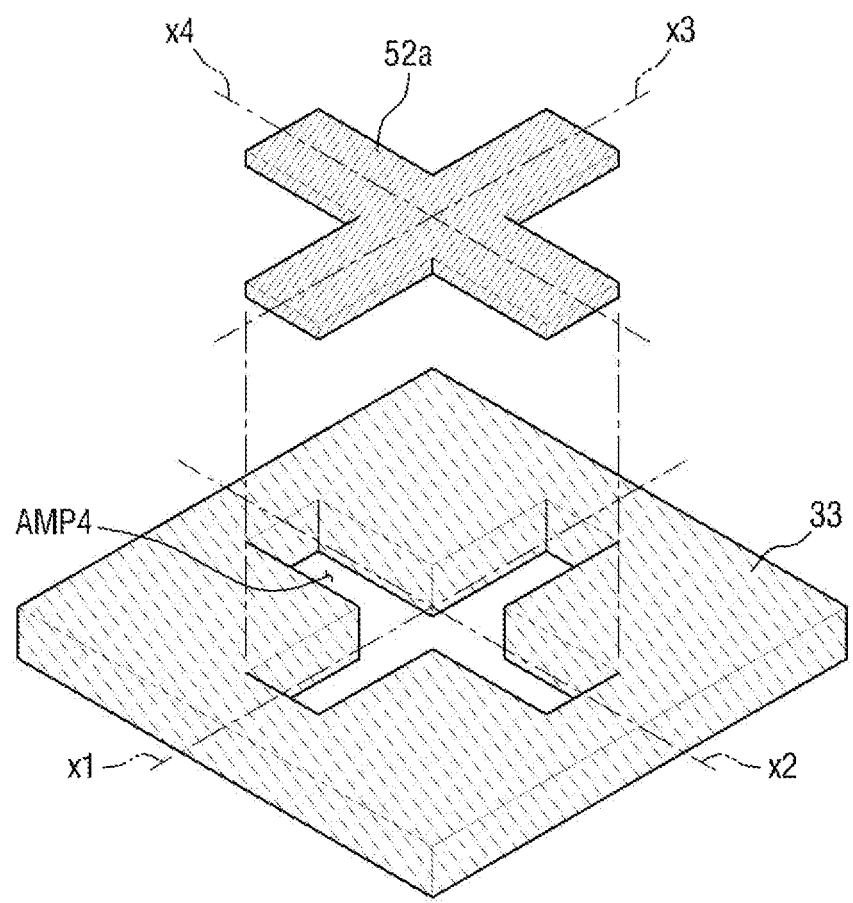
FIG. 14 is a perspective view illustrating an arrangement of an alignment mark and an external alignment mark according to another embodiment of the present invention.

Referring to FIG. 14, the arrangement relationship between the internal alignment mark formed by intaglio and the external alignment mark 52a will be described in more detail. FIG. 14 is a perspective view illustrating the arrangement of the internal alignment mark and the external alignment mark according to another embodiment of the present invention.

Referring to FIG. 14, when the integrated circuit 100 is seen from direction D1 or D2, the position alignment mark AMP4 and the external alignment mark 52a may be arranged so that the x3 axis overlaps the x1 axis, and the x4 axis overlaps the x2 axis. If the position alignment mark AMP4 and the external alignment mark 52a are arranged so that the x3 axis overlaps the x1 axis, and the x4 axis overlaps the x2 axis, the integrated circuit 100 can be aligned by applying the same position setting with respect to the alignment through the position alignment mark AMP4 and the alignment through the external alignment mark 52a during the chip mounting, and thus the convenience in the overlay registration metrology process can be increased.

The position alignment mark AMP4 may have a shape that completely overlaps the external alignment mark 52a. That is, the region within alignment mark area 31 that the intaglio alignment mark 33 is not arranged may coincide with the external alignment mark 52a, however, the shape of the position alignment mark AMP4 is not limited thereto, as the shape of the position alignment mark AMP4 may be varied within the range in which the x1 axis and the x2 axis are kept constant. For example, the size of the position alignment mark AMP4 may be larger or smaller than the external alignment mark 52a, and may have a shape that extends to be longer or shorter than the external alignment mark 52a in the direction of the x1 or x2 axis. Further, the position alignment mark AMP4 may keep the x1 axis and the x2 axis, but may have a shape that is quite different from the external alignment mark 52a. Further, although not illustrated, the case where the external alignment mark 52a is also formed by intaglio as shown in FIG. 5 is substantially the same.

Figure 15:
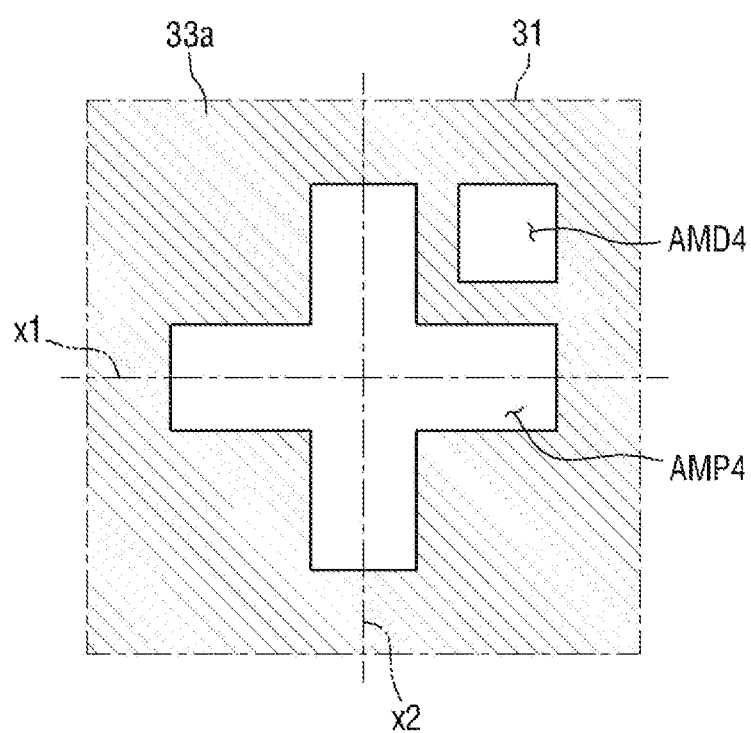
FIG. 15 is a plan view of an alignment mark area according to still another embodiment of the present invention.

Turning now to FIG. 15, FIG. 15 is a plan view of an alignment mark area according to still another embodiment of the present invention. Referring now to FIG. 15, the internal alignment mark may include a position alignment mark AMP4 and a direction alignment mark AMD4. That is, the locations of the position alignment mark AMP4 and the direction alignment mark AMD4 may be defined by the area in which the intaglio alignment mark 33a is absent within the intaglio alignment mark 33. Except that the direction alignment mark AMD4 is formed by intaglio, the direction alignment mark AMD4 may be substantially the same as the direction alignment mark AMD1 in FIG. 6.

Figure 16:
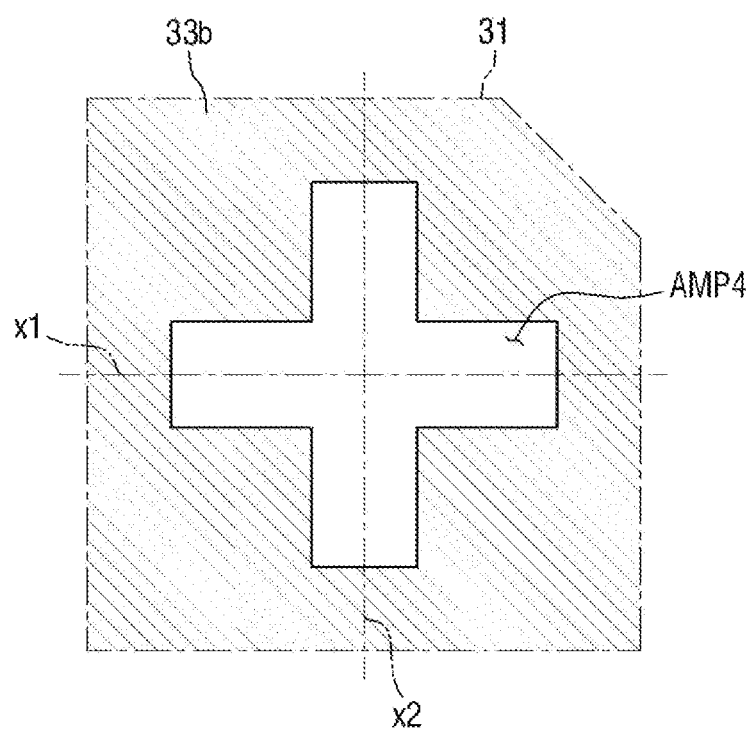
FIG. 16 is a plan view of an alignment mark area according to still another embodiment of the present invention.

Turning now to FIG. 16, FIG. 16 is a plan view of an alignment mark area according to still another embodiment of the present invention.

Referring to FIG. 16, the internal alignment mark may include a position alignment mark AMP4. The outer edge of the intaglio alignment mark 33b may have a shape that is not symmetrical with respect to the x1 axis and the x2 axis. For example, the outer edge of the intaglio alignment mark 33b may have a shape in which one corner of the rectangle has been cut. In addition, the outer edge of the intaglio alignment mark 33b may have various shapes which are not symmetrical with respect to the x1 axis and the x2 axis. If the outer edge of the intaglio alignment mark 33b has a shape that is not symmetrical with respect to the x1 axis and the x2 axis, the chip mounting machine may determine whether the integrated circuit 100 is in a reverse state through identifying the shape of the intaglio alignment mark 33b.

Figure 17:
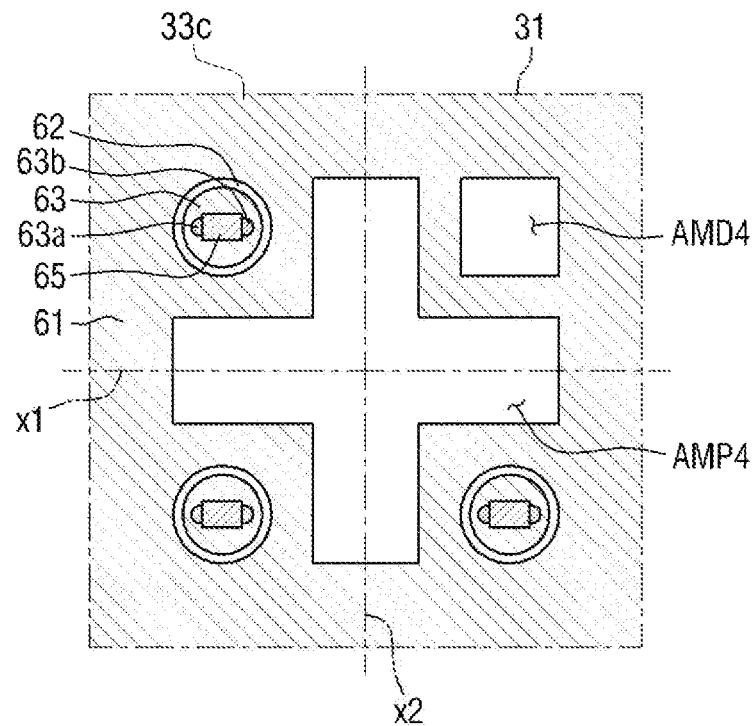
FIG. 17 is a plan view of an alignment mark area according to still another embodiment of the present invention.

Turning now to FIG. 17, FIG. 17 is a plan view of an alignment mark area 31 according to still another embodiment of the present invention.

Referring to FIG. 17, on an intaglio alignment mark 33c, an NMOS transistor may be arranged. The first p-type semiconductor 61 may be arranged according to the shape of the intaglio alignment mark 33c. On a partial area of the first p-type semiconductor 61, the n-type semiconductor 62, the second p-type semiconductor 63, the insulating film 64, and the gate electrode 65 may be arranged to form the NMOS transistor. The NMOS transistor formed on the intaglio alignment mark 33c may be electrically connected to other electronic elements that are included in the integrated circuit 100 through the wiring layer 40. The arrangement of the NMOS transistor illustrated in FIG. 17 is merely exemplary, and the position, quantity and the shape of the arranged NMOS transistors may be changed according to the embodiments. Once the NMOS transistor is formed on the internal alignment mark, the alignment mark area 31 can be used as a circuit, and thus the capacity of the integrated circuit 100 can be heightened.

Figure 18:
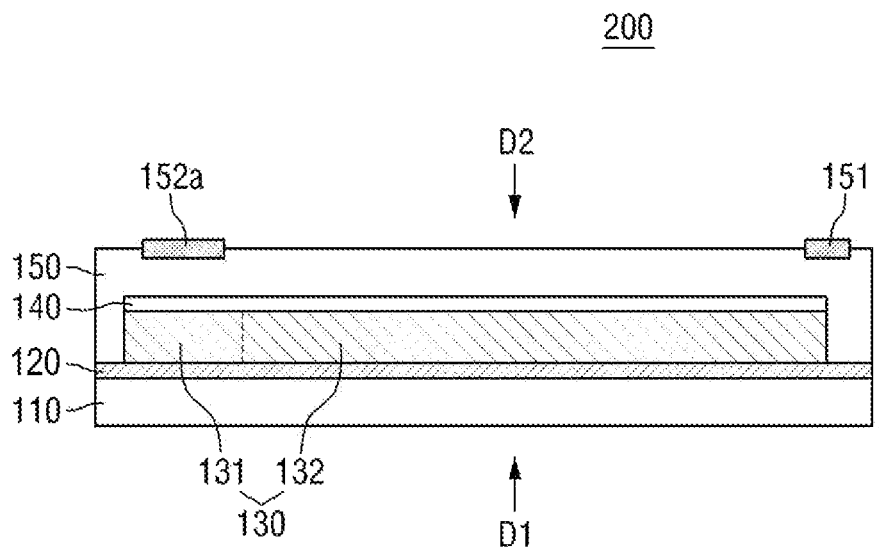
FIG. 18 is a cross-sectional view of an integrated circuit according to still another embodiment of the present invention.

Hereinafter, referring to FIG. 18, an integrated circuit 200 according to another embodiment of the present invention will be described. FIG. 18 is a cross-sectional view of an integrated circuit according to still another embodiment of the present invention. More specifically, the external appearance of an integrated circuit 200 may be substantially the same as the integrated circuit 100 in FIG. 1, and FIG. 18 is the cross-sectional view analogous to FIG. 2 taken along line II-II' in FIG. 1.

Referring to FIG. 18, the integrated circuit 200 may include a substrate 110, a first insulating layer 120, a semiconductor layer 130, a wiring layer 140, and a second insulating layer 150. The second insulating layer 150 may include bumps 151, and an external alignment mark 152 provided on one surface thereof. The configuration of the substrate 110, the first insulating layer 120, the wiring layer 140, and the second insulating layer 150 may be substantially the same as the configuration illustrated in FIG. 1.

The semiconductor layer 130 may include a main semiconductor layer 132 and an alignment mark area 131. Unlike the integrated circuit of FIGS. 1 and 2, the alignment mark area 131 and the main semiconductor layer 132 of the integrated circuit 200 of FIG. 18 may be connected to each other. As in FIGS. 1 and 2, the alignment mark area 131 may be arranged to overlap the external alignment mark 152.

Figure 19:
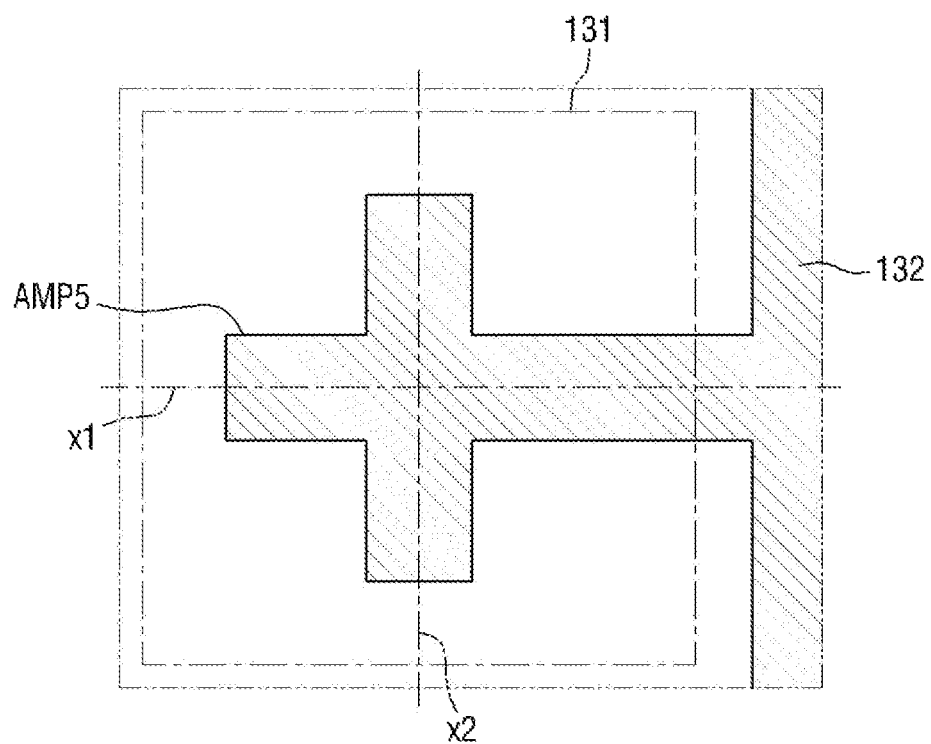
FIG. 19 is a plan view of an alignment mark area according to still another embodiment of the present invention.

Hereinafter, referring to FIG. 19, the alignment mark area 131 will be described in more detail. Turning now to FIG. 19, FIG. 19 is a plan view of the alignment mark area 131 according to still another embodiment of the present invention.

The internal alignment mark may include a position alignment mark AMP5. The position alignment mark AMP5 may have a shape that extends in the directions of the x1 axis and the x2 axis. The position alignment mark AMP5 may have a shape that is approximately symmetrical with respect to the x1 axis and the x2 axis. One side of the position alignment mark AMP5 may be connected to the main semiconductor layer 132. Although FIG. 19 illustrates that the position alignment mark AMP5 is connected to the main semiconductor layer 132 along the direction of the x1 axis, the connection of the position alignment mark AMP5 is not limited thereto, and the position alignment mark AMP5 may instead be connected to the main semiconductor layer 132 in other various ways. For example, the position alignment mark AMP5 may be connected to the main semiconductor layer 132 in the direction of the x2 axis or in the direction that is not related to the x1 axis or the x2 axis. Even if the position alignment mark AMP5 is connected to the main semiconductor layer 132, the position chip mounting machine can accurately align the integrated circuit 100 by calculating an error of the arrangement position of the integrated circuit 100 and an angle that is distorted in the horizontal direction through identification of the x1 axis and the x2 axis from the position alignment mark AMP5 during the chip mounting process.

Figure 20:
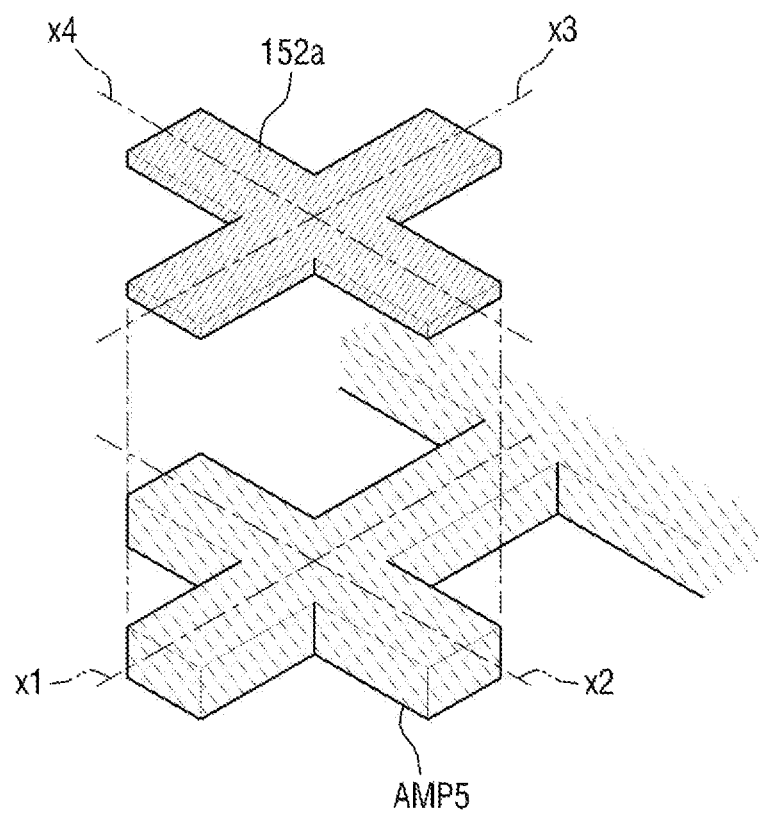
FIG. 20 is a perspective view illustrating an arrangement of an alignment mark and an external alignment mark according to still another embodiment of the present invention.

Referring to FIG. 20, the positional relationship between the internal alignment mark and the external alignment mark 152 will be described in more detail. Turning now to FIG. 20, FIG. 20 is a perspective view illustrating the arrangement of the internal alignment mark and the external alignment mark according to another embodiment of the present invention.

The external alignment mark 152 illustrated in FIG. 20 may be substantially the same as the external alignment mark 52a illustrated in FIG. 4. When the integrated circuit 100 is seen from direction D1 or D2, the position alignment mark AMP5 and the external alignment mark 152 may be arranged so that the x3 axis overlaps the x1 axis, and the x4 axis overlaps the x2 axis. If the position alignment mark AMP5 and the external alignment mark 152 are arranged so that the x3 axis overlaps the x1 axis and the x4 axis overlaps the x2 axis, the integrated circuit 100 can be aligned by applying the same position setting with respect to the alignment through the position alignment mark AMP5 and the alignment through the external alignment mark 152 during the chip mounting, and thus the convenience in processes can be increased. Further, although not illustrated, the case where the external alignment mark 52a is formed by intaglio may be substantially the same.

Figure 21:
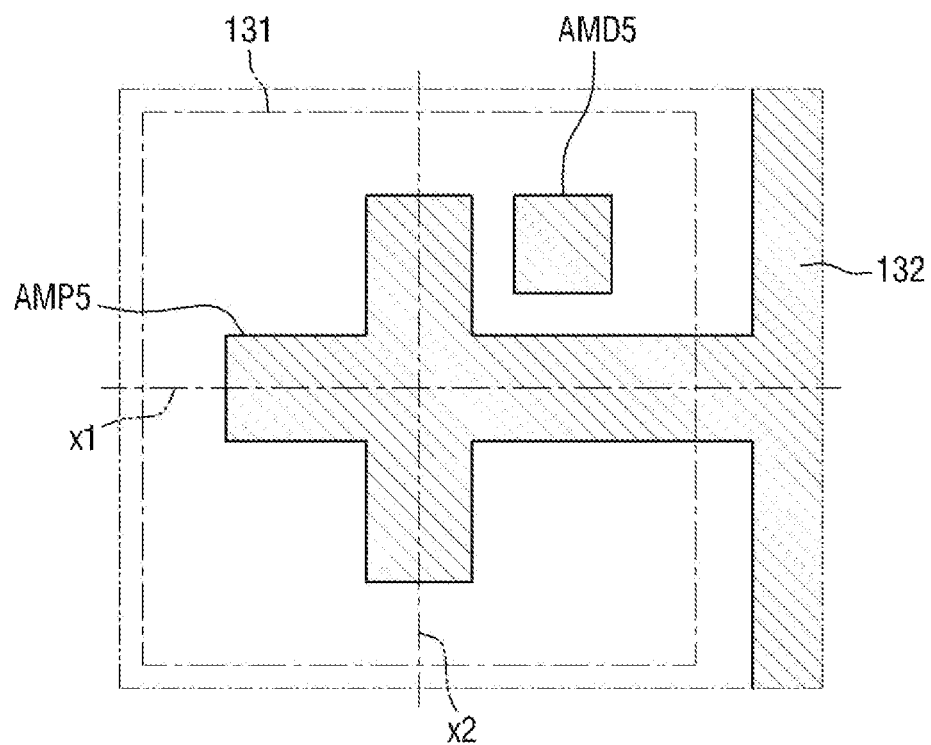
FIG. 21 is a plan view of an alignment mark area according to still another embodiment of the present invention.

Turning now to FIG. 21, FIG. 21 is a plan view of an alignment mark area 131 according to still another embodiment of the present invention. Referring to FIG. 21, the internal alignment mark may include a position alignment mark AMP5 and a direction alignment mark AMD5. The direction alignment mark AMD5 may be substantially the same as the direction alignment mark AMD1 illustrated in FIG. 6.

Figure 22:
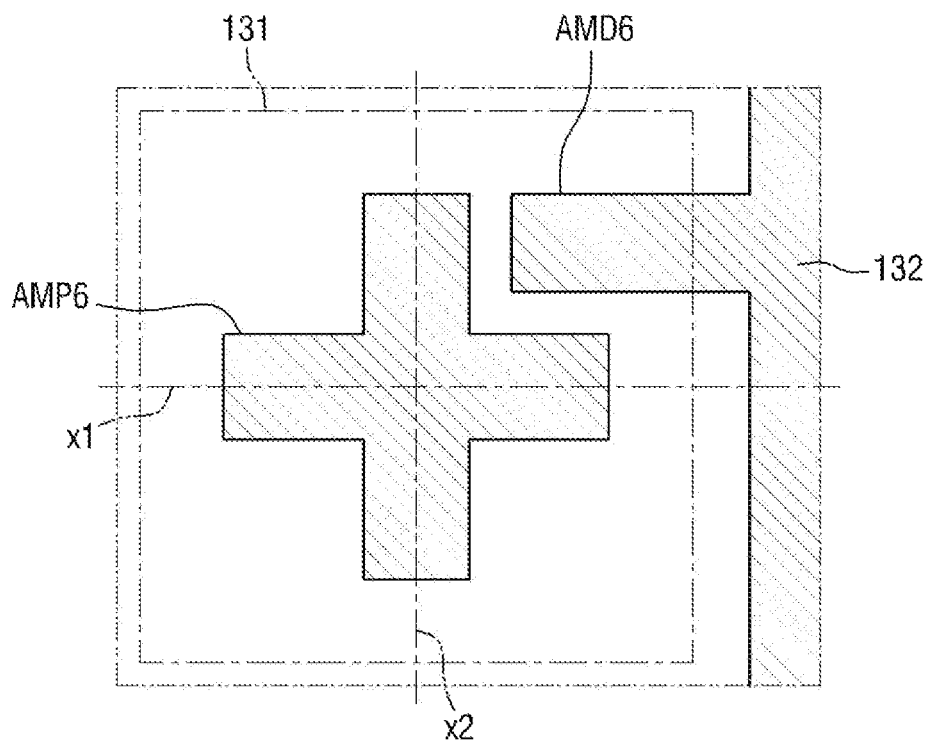
FIG. 22 is a plan view of an alignment mark area according to still another embodiment of the present invention.

Turning now to FIG. 22, FIG. 22 is a plan view of an alignment mark area 131 according to still another embodiment of the present invention. Referring to FIG. 22, the internal alignment mark may include a position alignment mark AMP6 and a direction alignment mark AMD6. The position alignment mark AMP6 may be substantially the same as the position alignment mark AMP1 illustrated in FIG. 5.

The direction alignment mark AMD6 may be connected to the main semiconductor layer 132. Even when the direction alignment mark AMD6 is connected to the main semiconductor layer 132, the position chip mounting machine can detect the direction alignment mark AMD6 through the infrared camera, and thus can determine whether the integrated circuit 200 is in a reverse state.

Figure 23:
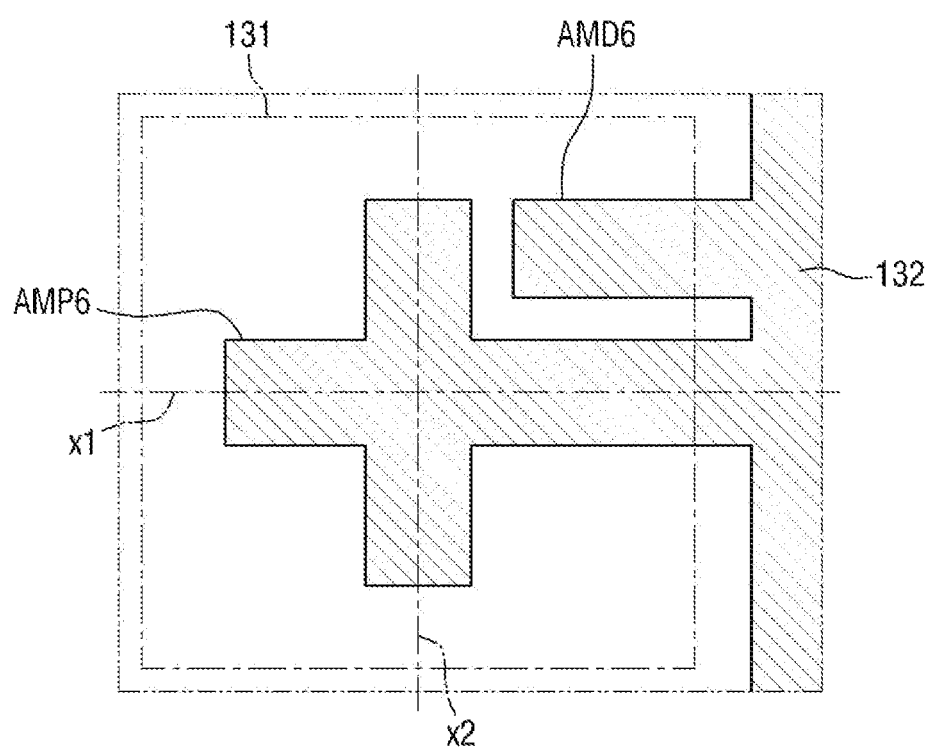
FIG. 23 is a plan view of an alignment mark area according to still another embodiment of the present invention.

Turning now to FIG. 23, FIG. 23 is a plan view of an alignment mark area 131 according to still another embodiment of the present invention. Referring to FIG. 23, the internal alignment mark may include a position alignment mark AMP5 and a direction alignment mark AMD6 that are both connected to the main semiconductor layer 132.

Figure 24:
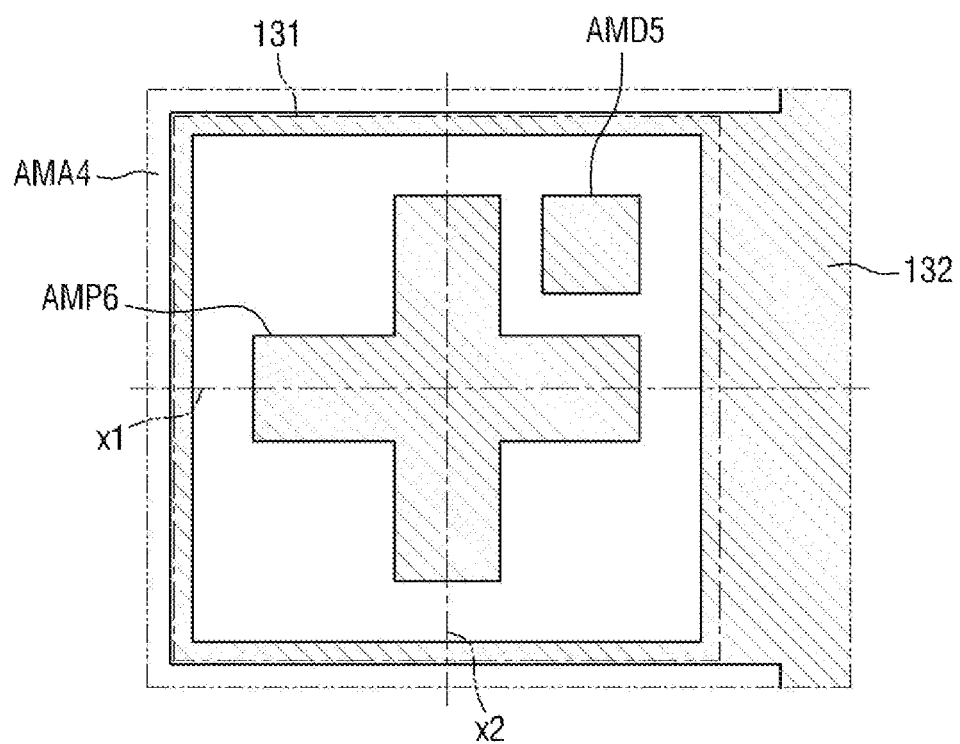
FIG. 24 is a plan view of an alignment mark area according to still another embodiment of the present invention.

Turning now to FIG. 24, FIG. 24 is a plan view of an alignment mark area 131 according to still another embodiment of the present invention. Referring to FIG. 24, the internal alignment mark may include a position alignment mark AMP6, a direction alignment mark AMD5, and an area definition alignment mark AMA4.

The area definition alignment mark AMA4 may be connected to the main semiconductor layer 132. FIG. 24 illustrates that one side of the area definition alignment mark AMA4 is connected to the main semiconductor layer 132, however, this is merely exemplary, and in some variations of this embodiment, several sides of the area definition alignment mark AMA4 may be connected to the main semiconductor layer 132, or only a part of the one side thereof may be connected to the main semiconductor layer 132. Although not illustrated in FIG. 24, in some embodiments, an NMOS transistor may be formed in the position alignment mark AMP6 or in the direction alignment mark AMD5.

Figure 25:
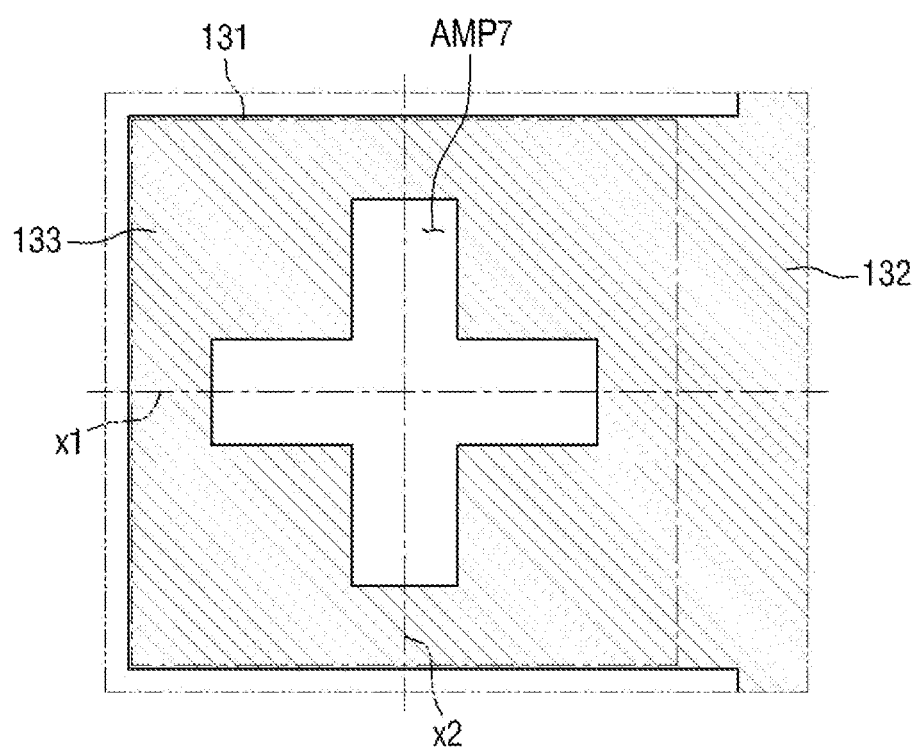
FIG. 25 is a plan view of an alignment mark area according to still another embodiment of the present invention.

Hereinafter, referring to FIGS. 25 and 26, internal alignment marks formed by intaglio according to embodiments will be described. Turning now to FIG. 25, FIG. 25 is a plan view of an alignment mark area according to still another embodiment of the present invention. Referring to FIG. 25, the internal alignment mark may be formed by intaglio. An intaglio alignment mark 133 that includes the p-type semiconductor may be arranged in the alignment mark area 131, and the internal area in which the intaglio alignment mark 133 is not arranged on the inside of the intaglio alignment mark 133 may function as the position alignment mark AMP7. The position alignment mark AMP7 may be substantially the same as the position alignment mark AMP4 in FIG. 13.

In FIG. 25, one side of the intaglio alignment mark 133 may be connected to the main semiconductor layer 132. FIG. 25 illustrates that one side of the intaglio alignment mark 133 is connected to the main semiconductor layer 132, however, this is merely exemplary, and in some variations, several sides of the intaglio alignment mark 133 may be connected to the main semiconductor layer 132, or only a part of the one side thereof may be connected to the main semiconductor layer 132.

Figure 26:
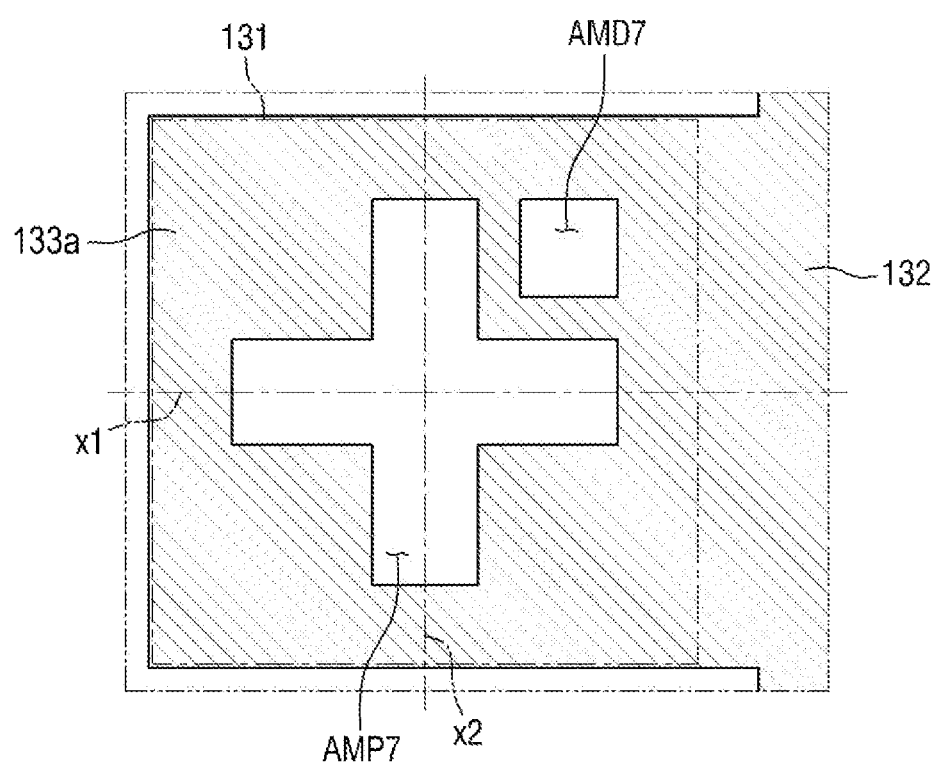
FIG. 26 is a plan view of an alignment mark area according to still another embodiment of the present invention.

Turning now to FIG. 26, FIG. 26 is a plan view of an alignment mark area 131 according to still another embodiment of the present invention. Referring to FIG. 26, the intaglio alignment mark 133a may be formed to include a position alignment mark AMP7 and a direction alignment mark AMD7. One side of the intaglio alignment mark 133a may be connected to the main semiconductor layer 132. FIG. 26 illustrates that one side of the intaglio alignment mark 133a is connected to the main semiconductor layer 132, however this is merely exemplary, and in some variations of this embodiment, several sides of the intaglio alignment mark 133a may be connected to the main semiconductor layer 132, or only a part of the one side thereof may be connected to the main semiconductor layer 132.

Figure 27:
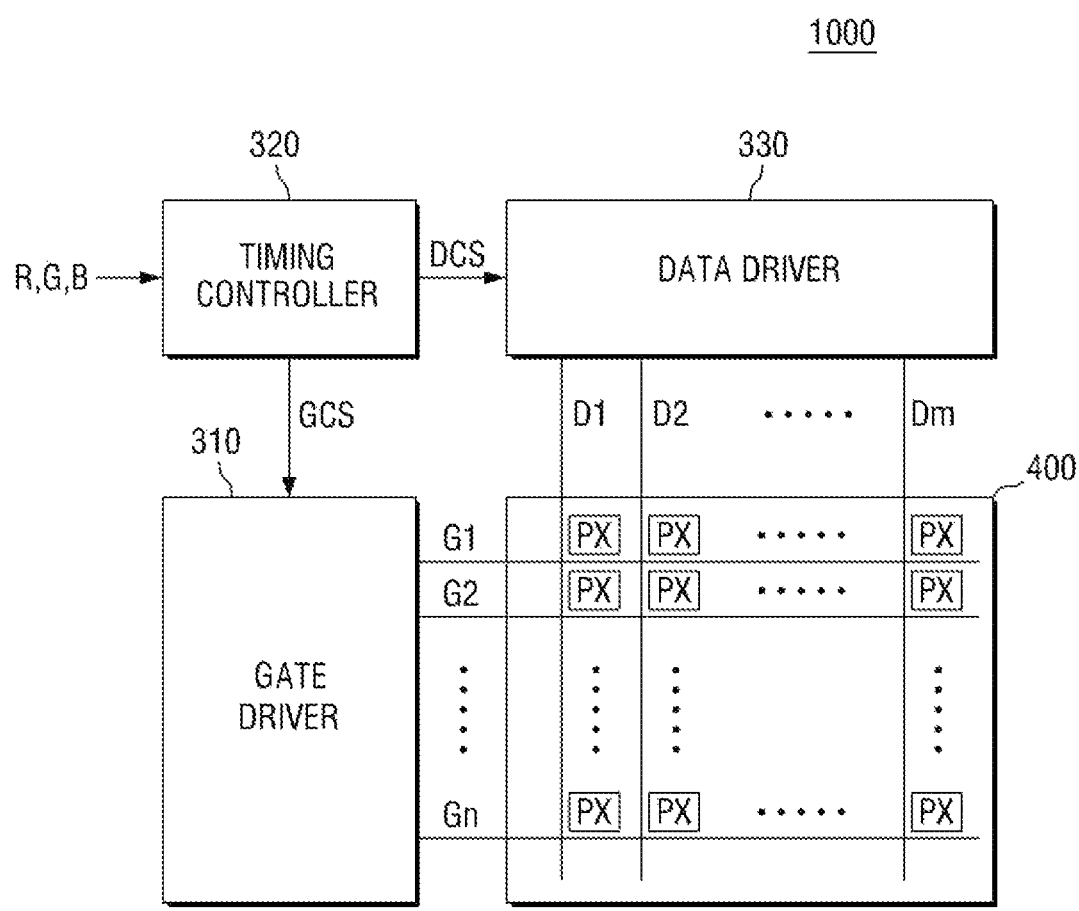
FIG. 27 is a block diagram of a display device according to an embodiment of the present invention.
Figure 28:
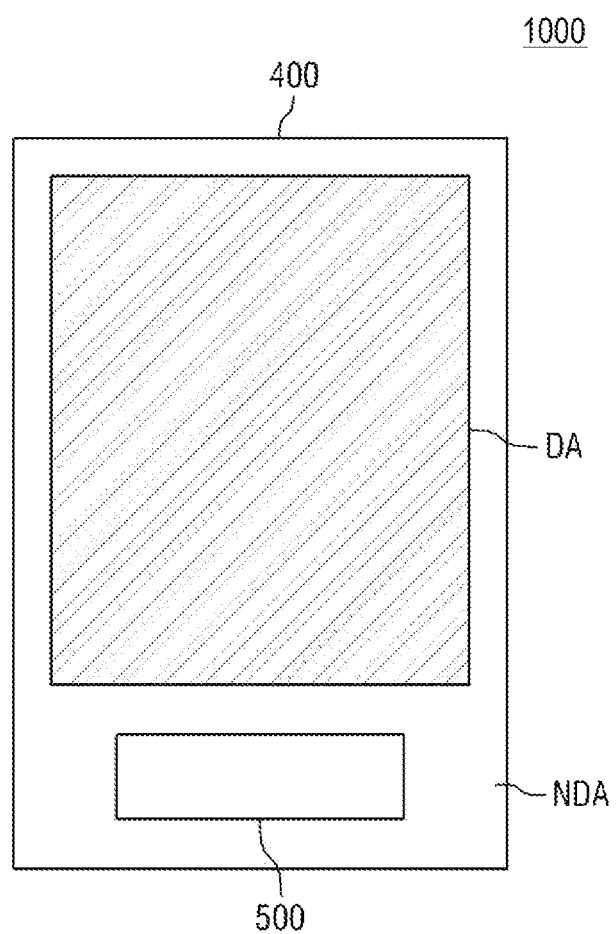
FIG. 28 is a plan view illustrating an arrangement of a display device according to an embodiment of the present invention.

Hereinafter, referring to FIGS. 27 to 29, a display device according to embodiments of the present invention will be described. FIG. 27 is a block diagram of a display device 1000 according to an embodiment of the present invention. Referring to FIG. 27, display device 1000 includes a display panel 400 and driving units 310, 320, and 330.

The display panel 400 includes a plurality of pixels PX. The display panel 400 may receive data signals D1, D2, . . . , and Dm and gate signals G1, G2, . . . , and Gn, and may display a corresponding image. The data signals D1, D2, . . . , and Dm may be signals regarding colors or grayscales of the image that is displayed on the display panel 400. The gate signals G1, G2, . . . , and Gn may be signals for determining whether the pixels PX receive the data signals D1, D2, . . . , and Dm. The display panel 400 may be a liquid crystal panel, an organic electroluminescent display panel, or an electrophoretic display panel.

The driving units 310, 320, and 330 may include a gate driver unit 310, a timing controller 320, and a data driver 330. The timing controller 320 may receive image data R, G, B and generate a gate driver control signal GCS for controlling the gate driver 310 and a data driver control signal DCS for controlling the data driver 330. The gate driver 310 may receive the gate driver control signal GCS and generate corresponding gate signals G1, G2, . . . , and Gn. The data driver 330 may receive the data driver control signal DCS, and generate corresponding data signal D1, D2, . . . , and Dm.

The gate driver 310, the timing controller 320, and the data driver 330 may be fabricated into an integrated circuit, respectively, and may be included within display device 1000. In some embodiments, the driving units 310, 320, and 330 may be fabricated into a signal integrated circuit and may be included within the display device 1000.

Hereinafter, referring to FIGS. 28 and 29, the arrangement of a display device 1000 including an integrated circuit 500 according to one embodiment of the present invention. FIG. 28 is a plan view illustrating an arrangement of an integrated circuit according to an embodiment of the present invention. Referring to FIG. 28, the display panel 400 may include a display area DA in which an image is displayed and a non-display area NDA in which the image is not displayed. An integrated circuit 500 may be arranged within the non-display area NDA. The integrated circuit 500 may correspond to one of the integrated circuits illustrated in FIGS. 1 to 26 according to the embodiments of the present invention. If the integrated circuit 500 is arranged on the non-display area NDA, an internal alignment mark including the p-type semiconductor or an internal alignment mark defined by an intaglio alignment mark including the p-type semiconductor can be easily detected via an infrared camera that is arranged in the direction of the surface on which the integrated circuit 500 of the display panel 400 is arranged without disturbing the visual field due to the display panel 400, and thus the position of the integrated circuit 500 can be accurately aligned.

Figure 29:
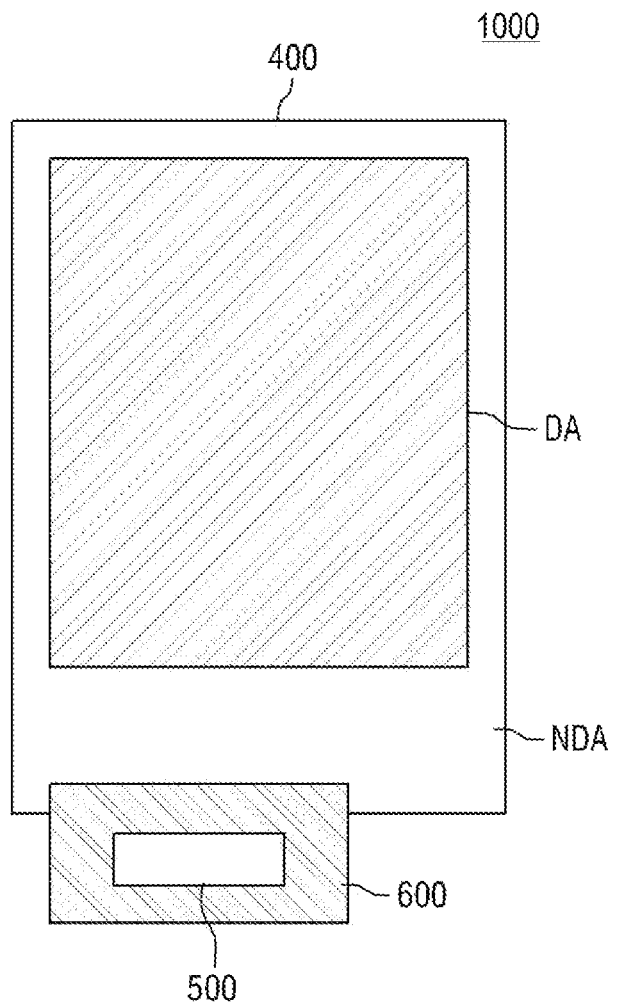
FIG. 29 is a plan view illustrating an arrangement of a display device according to another embodiment of the present invention.

Turning now to FIG. 29, FIG. 29 is a plan view illustrating another arrangement of another display device 1000 according to another embodiment of the present invention. Referring to FIG. 29, the display device 1000 may further include an affiliated substrate 600. The affiliated substrate 600 may be a flexible circuit board, but the present invention is not limited thereto. The affiliated substrate 600 may be connected to the non-display area NDA of the display panel 400. On the affiliated substrate 600, the integrated circuit 500 may be arranged. When the integrated circuit 500 is arranged on the affiliated substrate 600, an internal alignment mark including the p-type semiconductor or an internal alignment mark defined by the intaglio alignment mark including the p-type semiconductor can be easily detected via an infrared camera that is arranged in the direction of the surface on which the integrated circuit 500 of the affiliated substrate 600 is arranged without disturbing the visual field due to the affiliated substrate 600, and thus the position of the integrated circuit 500 can be accurately aligned.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An integrated circuit, comprising:
   a substrate;
   a semiconductor layer arranged on the substrate;
   an insulating layer arranged on an upper portion of the semiconductor layer; and
   a patterned metallic layer arranged on the insulating layer and on a top side of the integrated circuit, the patterned metallic layer including a plurality of bumps to output and receive signals to and from an outside and an external alignment mark visible from the top side of the integrated circuit,
   wherein the semiconductor layer includes a main semiconductor area and an alignment mark area spaced apart from the main semiconductor area, the alignment mark area includes an internal alignment mark, the internal alignment mark being a pattern visible by an infrared camera from a bottom and opposite side of the integrated circuit, wherein the pattern of the internal alignment mark corresponds to a doping pattern of the semiconductor layer and not an etching pattern of the semiconductor layer, the internal alignment mark being defined by one of a portion of the semiconductor layer within the alignment mark area that includes a p-type dopant or a portion of the semiconductor layer within the alignment mark area that is absent of a p-type dopant.

2. The integrated circuit of claim 1, wherein the substrate is a silicon substrate, wherein the semiconductor layer is unpatterned in a vicinity of the internal alignment mark and the semiconductor layer in a vicinity of the internal alignment mark includes both doped and undoped portions.

3. The integrated circuit of claim 1, wherein the pattern of the internal alignment mark has a same size and shape as that of the external alignment mark, the internal alignment mark being arranged directly underneath the external alignment mark taken in a thickness direction of the integrated circuit.

4. The integrated circuit of claim 1, wherein the pattern of the internal alignment mark is defined by a shape of an area where an infrared reflecting material that includes the p-type dopant is arranged and is present within the alignment mark area.

5. The integrated circuit of claim 4, wherein the internal alignment mark includes a position alignment mark.

6. The integrated circuit of claim 5, wherein the position alignment mark has a shape that is symmetrical with respect to a first axis and a second axis that is orthogonal to the first axis.

7. The integrated circuit of claim 1, wherein the internal alignment mark includes an NMOS transistor.

8. The integrated circuit of claim 7, wherein the p-type semiconductor includes a first p-type semiconductor and a second p-type semiconductor arranged over the first p-type semiconductor and being spaced apart from the first p-type semiconductor, and
   the NMOS transistor includes the first p-type semiconductor, the second p-type semiconductor, and an n-type semiconductor arranged between the first p-type semiconductor and the second p-type semiconductor.

9. The integrated circuit of claim 8, wherein the second p-type semiconductor includes a first doping area and a second doping area which are spaced apart from each other and are n+ doped, and
   the NMOS transistor further includes a gate electrode arranged between the first doping area and the second doping area.

10. The integrated circuit of claim 1, wherein the internal alignment mark includes a plurality of NMOS transistors.

11. The integrated circuit of claim 6, wherein the position alignment mark is cross-shaped.

12. The integrated circuit of claim 6, wherein the position alignment mark is diamond-shaped, wherein each of the sides of the diamond form oblique angles with edges of the substrate.

13. The integrated circuit of claim 6, wherein the internal alignment mark further includes a direction alignment mark.

14. The integrated circuit of claim 13, wherein the direction alignment mark is asymmetrical with respect to the first axis and the second axis.

15. The integrated circuit of claim 14, wherein the direction alignment mark is spaced apart from the position alignment mark.

16. The integrated circuit of claim 15, wherein the internal alignment mark further includes an area definition alignment mark that defines the alignment mark area.

17. The integrated circuit of claim 16, wherein the area definition alignment mark surrounds a circumference of the alignment mark area, and
the position alignment mark and the direction alignment mark are arranged within the area definition alignment mark.

18. The integrated circuit of claim 1, wherein the pattern of the internal alignment mark is defined by a shape of an area where an infrared-reflecting material and the p-type dopant is absent within the alignment mark area.

19. The integrated circuit of claim 18, wherein the alignment mark area includes an NMOS transistor.

20. The integrated circuit of claim 18, wherein the internal alignment mark includes:
a position alignment mark, the positional alignment mark being a cross-shaped area where the p-type dopant is absent, the positional alignment mark being symmetrical about first and second axes, and wherein the infrared-reflecting material being portions of the semiconductor layer doped with a p-type dopant;
a directional alignment mark asymmetrical about the first and second axes; and
an area alignment mark surrounding the positional and directional alignment marks.

21. The integrated circuit of claim 18, wherein the internal alignment mark includes a position alignment mark, and wherein the infrared-reflecting material being the semiconductor layer doped with a p-type dopant, wherein the position alignment mark is symmetrical with respect to a first axis and a second axis that is orthogonal to the first axis.

22. The integrated circuit of claim 21, wherein the position alignment mark is cross-shaped.

23. The integrated circuit of claim 21, wherein the position alignment mark is diamond-shaped.

24. The integrated circuit of claim 21, wherein the internal alignment mark further includes a direction alignment mark.

25. The integrated circuit of claim 24, wherein the direction alignment mark is asymmetrical with respect to the first axis and the second axis.

26. The integrated circuit of claim 4, wherein the infrared-reflecting material being the semiconductor layer doped with a p-type dopant.

27. An integrated circuit, comprising:
a substrate;
a semiconductor layer arranged on the substrate;
an insulating layer arranged on an upper portion of the semiconductor layer; and
a patterned metallic layer arranged on the insulating layer and corresponding to a top side of the integrated circuit, the patterned metallic layer including a plurality of bumps to output and receive signals to and from an outside and an external alignment mark visible from the top side of the integrated circuit,
wherein the semiconductor layer includes a main semiconductor area and an internal alignment mark area that are connected to each other, the internal alignment mark area includes an internal alignment mark that is a pattern visible by an infrared camera from a bottom and opposite side of the integrated circuit, the pattern of the internal alignment mark being defined by a doping pattern of the semiconductor layer and not by an etching pattern of the semiconductor layer and not by a pattern of where the semiconductor layer is present within the internal alignment mark area.

28. The integrated circuit of claim 27, wherein the substrate is a silicon substrate.

29. The integrated circuit of claim 27, wherein the external alignment mark overlaps the internal alignment mark.

30. The integrated circuit of claim 27, wherein the pattern of the internal alignment mark is defined by a shape of an area where an infrared reflecting material is arranged and present within the alignment mark area that corresponds to an area of the semiconductor layer where p-type dopants are present.

31. The integrated circuit of claim 27, wherein the pattern of the internal alignment mark corresponds to either where the p-type dopant is present or where the p-type dopant is absent from the semiconductor layer in the internal alignment mark area and not to an etched pattern of the semiconductor layer, the semiconductor layer within the internal alignment mark area includes both doped and undoped portions.

32. The integrated circuit of claim 27, wherein the internal alignment mark includes a position alignment mark, wherein the position alignment mark is connected to the main semiconductor layer.

33. The integrated circuit of claim 31, wherein the internal alignment mark further includes a direction alignment mark, wherein the direction alignment mark is connected to the main semiconductor layer.

34. The integrated circuit of claim 27, wherein the infrared reflecting material being a p-type semiconductor.

35. The integrated circuit of claim 33, wherein the internal alignment mark further includes an area definition alignment mark that defines the alignment mark area, the area definition alignment mark being connected to the main semiconductor area.

36. The integrated circuit of claim 27, wherein the pattern of the internal alignment mark having a same size and shape as that of the external alignment mark, the internal alignment mark being arranged directly underneath the external alignment mark taken in a thickness direction of the integrated circuit.

37. An integrated circuit, comprising:
a substrate;
a semiconductor layer arranged on the substrate; and
an insulating layer arranged on an upper portion of the semiconductor layer and including a bump provided on an upper surface thereof,
wherein the semiconductor layer includes a main semiconductor layer and an intaglio alignment mark including a p-type semiconductor that is connected to the main semiconductor area, wherein an internal alignment mark is defined by an area surrounded by the intaglio alignment mark and where the p-type semiconductor is absent.

38. The integrated circuit of claim 37, wherein the substrate is a silicon substrate.

39. The integrated circuit of claim 37, further comprising an external alignment mark arranged on an upper surface of the insulating layer, the external alignment mark overlapping the internal alignment mark.

40. The integrated circuit of claim 37, wherein the internal alignment mark includes a position alignment mark.

41. The integrated circuit of claim 40, wherein the internal alignment mark further includes a direction alignment mark.

42. The integrated circuit of claim 41, wherein the internal alignment mark further includes an area definition alignment mark that defines an alignment mark area, and
the position alignment mark and the direction alignment mark are arranged within the area definition alignment mark.

43. A display device, comprising:
a display panel; and a driving unit to drive the display panel, wherein the driving unit includes an integrated circuit, the integrated circuit including:
  a substrate;
  a semiconductor layer arranged on the substrate;
  an insulating layer arranged on an upper portion of the semiconductor layer; and
  a patterned metallic layer arranged on the insulating layer and on a top side of the integrated circuit facing the display panel, the patterned metallic layer including a plurality of bumps to output and receive signals to and from an outside and an external alignment mark visible from the top side of the integrated circuit,
  wherein the semiconductor layer includes an alignment mark area that includes an internal alignment mark having a pattern that is visible by an infrared camera from a bottom and opposite side of the integrated circuit to align and attach the integrated circuit to the display panel, wherein the pattern of the internal alignment mark being defined by one of either a pattern in the semiconductor layer where p-type dopants are present or a pattern in the semiconductor layer where p-type dopants are absent, wherein the semiconductor layer within the alignment mark area includes both doped and undoped portions.

44. The display device of claim 43, wherein the substrate is a silicon substrate, wherein the semiconductor layer is unpatterned within the alignment mark area, wherein the pattern of the internal alignment mark corresponds to one of either a pattern of the doped portion or a pattern of the undoped portion of the semiconductor layer within the alignment mark area.

45. The display device of claim 43, wherein the pattern of the internal alignment mark having a same size and shape as that of the external alignment mark, the internal alignment mark being arranged directly underneath the external alignment mark taken in a thickness direction of the integrated circuit.

46. The display device of claim 43, wherein the pattern of the internal alignment mark is defined by a shape of an area where a p-type semiconductor is arranged within the alignment mark area.

47. The display device of claim 46, wherein the internal alignment mark includes a position alignment mark.

48. The display device of claim 47, wherein the internal alignment mark further includes a direction alignment mark.

49. The display device of claim 48, wherein the internal alignment mark further includes an area definition alignment mark that defines the alignment mark area.

50. The display device of claim 43, wherein the internal alignment mark includes;
  a position alignment mark, the positional alignment mark being a cross-shaped area where the p-type dopant is absent, the positional alignment mark being symmetrical about first and second axes, and wherein the infrared-reflecting material being portions of the semiconductor layer doped with a p-type dopant;
  a directional alignment mark asymmetrical about the first and second axes; and
  an area alignment mark surrounding the positional and directional alignment marks.

51. The display device of claim 43, wherein the internal alignment mark includes a first portion that reflects infrared radiation and a second portion that transmits infrared radiation, the pattern of the internal alignment mark is defined by a shape of an area where the first portion is present.

52. The display device of claim 43, wherein the internal alignment mark further includes a first portion that reflects infrared radiation and a second portion that transmits infrared radiation, the pattern of the internal alignment mark is defined by a shape of an area where the first portion is absent.

* * * * *